(12) United States Patent
Gregerson et al.

(10) Patent No.: US 7,987,653 B2
(45) Date of Patent: Aug. 2, 2011

(54) PLASTIC EMBOSSED CARRIER TAPE PROCESS

(75) Inventors: Barry L. Gregerson, Deephaven, MN (US); James E. Spitzer, Excelsior, MN (US)

(73) Assignee: Adaptsys Limited, Petersfield, Hampshire (GB)

( * ) Notice: Subject to any disclaimer, the term of this patent is extended or adjusted under 35 U.S.C. 154(b) by 0 days.

(21) Appl. No.: 12/349,034

(22) Filed: Jan. 6, 2009

(65) Prior Publication Data
US 2009/0133367 A1 May 28, 2009

Related U.S. Application Data

(62) Division of application No. 10/815,475, filed on Apr. 1, 2004, now Pat. No. 7,771,187.

(60) Provisional application No. 60/459,335, filed on Apr. 1, 2003.

(51) Int. Cl.
*B65B 9/04* (2006.01)
*B65B 41/00* (2006.01)
*B65B 15/04* (2006.01)
*B65B 47/02* (2006.01)
*B65B 47/06* (2006.01)

(52) U.S. Cl. ............... 53/453; 53/471; 53/559; 53/281; 53/51; 53/77

(58) Field of Classification Search .............. 53/140, 53/281, 453, 471, 467, 51, 55, 64, 67, 69, 53/77, 559, 561; 226/24, 37, 43, 44; 264/284; B65B 47/02, 47/04, 47/06, 15/04, 41/00
See application file for complete search history.

(56) References Cited

U.S. PATENT DOCUMENTS

| 2,522,657 | A | * | 9/1950 | Wilcox | 53/290 |
| 2,660,219 | A | * | 11/1953 | Haas et al. | 53/77 |
| 2,970,414 | A | * | 2/1961 | Rohdin | 53/453 |
| 3,000,157 | A | * | 9/1961 | Ollier et al. | 53/559 |
| 3,270,482 | A | * | 9/1966 | Kraut | 53/427 |
| 3,577,700 | A | * | 5/1971 | Bippus et al. | 53/453 |
| 3,642,411 | A | * | 2/1972 | Desnick et al. | 264/322 |
| 3,706,517 | A | * | 12/1972 | Wheaton, III et al. | 425/533 |
| 3,762,251 | A | * | 10/1973 | Madsen et al. | 83/39 |

(Continued)

FOREIGN PATENT DOCUMENTS

GB 2177379 A * 1/1987

(Continued)

OTHER PUBLICATIONS

Machine translation of JP 10-1120, retrieved from JPO website, http://www4.ipdl.inpit.go.jp/Tokujitu/tjsogodbenk.ipdl, Sep. 8, 2010, 8 pages.*

(Continued)

*Primary Examiner* — Stephen F Gerrity
(74) *Attorney, Agent, or Firm* — Anthony J. Bourget

(57) ABSTRACT

An embossed carrier tape manufacturing apparatus includes features for integrating with other processing equipment so that other processes such as forming, filling, and sealing the tape can be performed sequentially in one integrated process. The apparatus includes retractable contact spot heaters for heating the tape prior to embossing, along with a unique heat shield arrangement that is interposable between the heaters and the tape so that the process may be paused. Also, a synchronizing apparatus is integrated so that the carrier tape embossing process may be automatically paused for adjusting to the input rate of other carrier tape processing apparatus.

36 Claims, 30 Drawing Sheets

U.S. PATENT DOCUMENTS

| | | | |
|---|---|---|---|
| 3,904,338 A * | 9/1975 | Straumanis | 264/40.7 |
| 4,188,770 A * | 2/1980 | Tabur | 53/509 |
| 4,195,840 A * | 4/1980 | Spieth et al. | 273/406 |
| 4,349,997 A * | 9/1982 | Hayasaka et al. | 53/51 |
| 4,354,337 A * | 10/1982 | Mori et al. | 53/559 |
| 4,430,914 A * | 2/1984 | Keim | 83/35 |
| 4,561,581 A * | 12/1985 | Kelly | 226/42 |
| 4,630,426 A * | 12/1986 | Gentry | 53/453 |
| 4,724,658 A * | 2/1988 | Birkenfeld et al. | 53/557 |
| 4,768,885 A * | 9/1988 | Maier | 374/1 |
| 4,778,372 A * | 10/1988 | Mutti et al. | 425/294 |
| 4,875,329 A * | 10/1989 | Miselli | 53/559 |
| 5,385,465 A * | 1/1995 | Greiwe et al. | 425/308 |
| 5,437,546 A * | 8/1995 | Dupraz | 425/223 |
| 5,466,326 A * | 11/1995 | Cherney | 53/51 |
| 5,571,473 A * | 11/1996 | Fujii | 264/510 |
| 5,626,804 A * | 5/1997 | Benkowski et al. | 264/40.5 |
| 5,802,821 A * | 9/1998 | Albrecht | 53/559 |
| 5,939,107 A * | 8/1999 | Arends et al. | 425/397 |
| 6,098,381 A * | 8/2000 | Schmelzer | 53/77 |
| 6,250,051 B1 * | 6/2001 | Mori et al. | 53/453 |
| 6,257,866 B1 * | 7/2001 | Fritz et al. | 425/387.1 |
| 6,325,607 B1 * | 12/2001 | Atake | 425/122 |
| 6,380,549 B1 * | 4/2002 | Oster et al. | 250/559.42 |
| 6,659,758 B2 * | 12/2003 | Ekendahl et al. | 425/504 |
| 2002/0100257 A1 * | 8/2002 | Nakamura et al. | 53/559 |
| 2002/0157355 A1 * | 10/2002 | Tampieri | 53/453 |
| 2004/0253333 A1 * | 12/2004 | Otsuka | 425/112 |

FOREIGN PATENT DOCUMENTS

| | | | |
|---|---|---|---|
| JP | 56109115 A | * | 8/1981 |
| JP | 03289421 A | * | 12/1991 |
| JP | 05147606 A | * | 6/1993 |
| JP | 06048421 A | * | 2/1994 |
| JP | 10001120 A | * | 1/1998 |
| JP | 10264908 A | * | 10/1998 |
| JP | 2002037205 A | * | 2/2002 |
| JP | 2003312608 A | * | 11/2003 |

OTHER PUBLICATIONS

Ikeda Tomaki, et al., Embossment Carrier Tape Molding Machine, Japane Patent Publication No. 2000-062023—English Machine Translation, Publication Date of Feb. 29, 2000.

* cited by examiner

PLASTIC EMBOSSED CARRIER TAPE PROCESS

CLAIM TO PRIORITY

This application is a division of, and claims priority under 35 U.S.C. §120 to, the U.S. patent application Ser. No. 10/815,475 filed on Apr. 1, 2004, now U.S. Pat. No. 7,771,187, which claims priority under 35 U.S.C. §119(e) to the U.S. Provisional Patent application 60/459,335 filed on Apr. 1, 2003, the entire contents of which are incorporated herein by this reference.

FIELD OF THE INVENTION

The present invention relates to embossed carrier tape manufacturing apparatus and processes, and specifically to apparatus and processes for manufacturing, filling, and sealing embossed carrier tapes with electronic components.

BACKGROUND OF THE INVENTION

Modern semiconductors have become extremely complex and are highly susceptible to damage from external influences, such as contaminants, mechanical shock, electrostatic discharges and physical contact. Accordingly, various types of carriers have been developed to protect the delicate semiconductors as they are transported between the many process steps needed for production of a finished electronic circuit or device. Various types of carriers have been developed for this purpose and are known in the art, including carrier tapes that are designed to carry the components in a continuous fashion.

Carrier tapes are also widely used for a variety of devices other than semi-conductors. Such other devices include connectors, sockets, electromechanical components, and passive/discrete components. Packaging devices in carrier tape enables automatic loading and unloading of devices into and out of the carrier tape and provides an efficient and compact means to ship product from one location to another.

One popular type of carrier tape includes a continuous strip of thermoplastic material with a series of pockets embossed therein, each pocket for containing one component. The margins of the strip typically have sprocket holes so that the tape can be moved between process steps by a conveyor system using sprockets adapted to engage the sprocket holes. Typically, a cover tape is placed over the pockets so as to retain the components.

Since robotic tools are often used in device manufacturing processes to remove components from the pockets in carrier tape, there is a need for great precision in component positioning. Consequently, pockets must be precisely spaced and indexed with the sprocket holes to ensure an accurately repeatable, predictable position for the component. Also, the component positioning surfaces within each pocket must be uniform and free from distortion that may cause variations in component positioning.

Previously, inefficiencies have been associated with the use of embossed carrier tape that have tended to reduce its use. Typically, in previous processes, carrier tape is embossed in one process and is wound on large rolls for transport to another location where the components are loaded in the pockets and cover tape is applied. In addition to inefficiency resulting from the extra transport step itself, the rolls of carrier tape with formed pockets are much bulkier than flat rolls of carrier tape stock, leading to further transport inefficiency. Also, the formed pockets are subject to crushing and other damage in handling.

Previous embossed carrier tape manufacturing processes have proven difficult to integrate with component filling and sealing processes. Typically, in these previous processes, entire sections of tape are heated prior to embossing the pockets. Consequently, it is difficult to stop and start the tape manufacturing process as may be needed to accommodate a differing input rate for a pocket filling apparatus, without causing heat damage to a section of the tape or introducing an unacceptable delay while the heater is shut down and restarted. A damaged section of tape in a roll is unacceptable and results in rejection of the entire roll.

A need exists in the industry for a carrier tape manufacturing apparatus that is easily integratable with filling and sealing processes.

SUMMARY OF THE INVENTION

The present invention substantially meets the aforementioned needs of the industry. An embossed carrier tape manufacturing apparatus according to the present invention includes features for integrating with other processing equipment so that other processes such as forming, filling, and sealing the tape can be performed sequentially in one integrated process. The apparatus includes retractable contact spot heaters for heating the tape prior to embossing, along with a unique heat shield arrangement that is interposable between the heaters and the tape so that the process may be paused. Also, a synchronizing apparatus is integrated so that the carrier tape embossing process may be automatically paused for adjusting to the input rate of other carrier tape processing apparatus.

In an embodiment of the invention an apparatus for automatically embossing carrier pockets in a continuous strip of plastic material to form a carrier tape includes a guide structure for positioning and guiding the strip in the apparatus, and a drive assembly adapted to selectively engage and feed the strip through the guide structure in a sequence of adjacent uniform increments. A heating assembly is positioned adjacent the guide structure and adapted to heat at least one region on each increment of the strip. The heating assembly includes a pair of selectively positionable contact portions adapted to contact and apply heat to opposite surfaces of the strip at the region. The contact portions are positionable in a retracted position wherein the contact portions are spaced apart from the strip. A heat shield assembly is arranged to selectively interpose a heat shield between each of the pair of contact portions and the strip when the contact portions are positioned in the retracted position. A molding assembly is positioned adjacent the guide structure for molding the heated region into a pocket. The molding assembly includes a pair of mold portions selectively contactable with the region, including a male mold portion and a corresponding female mold portion. The female mold portion has an opening defined therein. The opening is selectively operably connected with a supply of compressed gas, so that a stream of compressed gas may be selectively directed from the opening against the strip to urge the strip against the male mold.

The drive assembly of the carrier tape embossing apparatus may include a drive roller and an opposing friction roller positioned so as to frictionally engage the strip therebetween, and the drive roller may be driven by a precision servo motor so that the strip is accurately and precisely positioned for the embossing process. The friction roller may be selectively positionable in at least a first position wherein the friction roller is engaged with the strip and a second position wherein the friction roller is spaced apart from the strip. The strip of plastic material may have a series of uniformly spaced sprocket holes, and the molding assembly may have a plurality of pilot pins selectively engageable with the sprocket holes. When the pilot pins are engaged with the sprocket holes during embossing, the drive mechanism may be disengaged from the strip so as to eliminate any run-out or accumulative positioning error resulting from the drive mechanism.

The heat shield assembly may include a body portion and a pair of spaced apart shield plate portions projecting therefrom. The shield plate portions are adapted to be selectively positionable so that each shield member is disposed between the strip and one of the contact portions of the heating assembly. The heat shield assembly may include air diffusers in the body portion positioned so as to direct air onto a surface of a separate one of the shield plate portions. Alternatively, the heat shields themselves may be air curtains.

A punching assembly may be positioned adjacent the guide structure. The punching assembly may have at least one punch pin arranged to be selectively contactable with the pocket so as to punch a hole therein. The punch pin has a shaft with a head portion defined at a distal end thereof. The head has a first cross-sectional dimension, and the shaft has a portion with a smaller cross sectional dimension adjacent the head portion to enable the tape material to shrink slightly after the hole is punched without causing puckering or distortion in the pocket bottom.

The apparatus may further include an indexing assembly for accurately positioning the strip in the guide structure. The indexing assembly may have a ball detent mechanism with a ball portion positioned and adapted to selectively engage and register the sprocket holes in the tape.

A control system may be operably connected at least with the drive assembly, the heating assembly, the heat shield assembly, and the molding assembly. The control system may define a normal automatic operating mode for the apparatus, wherein the uniform increments are successively automatically fed to the heating assembly and the molding assembly through the guide structure using the drive mechanism, and a selectively actuatable pause mode, wherein the strip is held stationary in the guide structure, the contact portions are positioned in the retracted position, and the heat shields are positioned between the contact portions and the strip.

The apparatus may also include a synchronizing assembly arranged to receive embossed carrier tape from the embossing apparatus and supply it to other pieces of carrier tape processing equipment in a continuous fashion. The synchronizing assembly may include a pair of sensors. A first sensor is arranged to generate a signal when the amount of carrier tape present in the synchronizing assembly is in excess of a first predetermined amount. A second sensor is arranged to generate a signal when the amount of carrier tape present in the synchronizing assembly is less than a second predetermined amount. Each of the pair of sensors is operably connected with the control system. The control system is adapted to automatically initiate the pause mode when the amount of carrier tape present in the synchronizing assembly is in excess of the first predetermined amount and to automatically initiate the normal automatic operating mode when the amount of carrier tape present in the synchronizing assembly is less than a second predetermined amount.

The invention may also include a process for forming a uniform series of carrier pockets in a continuous strip of plastic material to form a carrier tape by sequentially embossing at least one carrier pocket in adjacent increments of the strip. The process includes the steps of:

(a) automatically positioning an increment of the strip between a pair of opposing selectively positionable heating contact surfaces;

(b) momentarily contacting the strip with the contact surfaces so as to heat a region of the increment to a forming temperature;

(c) positioning the increment so that the region is between a pair of selectively positionable mold members, the pair of mold members including a male mold member and a female mold member;

(d) engaging the region with the male and female mold members to form the pocket;

(e) selectively intermittently pausing the process by maintaining the strip in a fixed position and interposing a heat shield between each heating contact surface and the strip to inhibit heat transfer from the contact surfaces to the strip; and (f) repeating steps (a), (b), (c), (d), and (e) for adjacent increments of the strip.

DETAILED DESCRIPTION OF THE INVENTION

Figure 3:
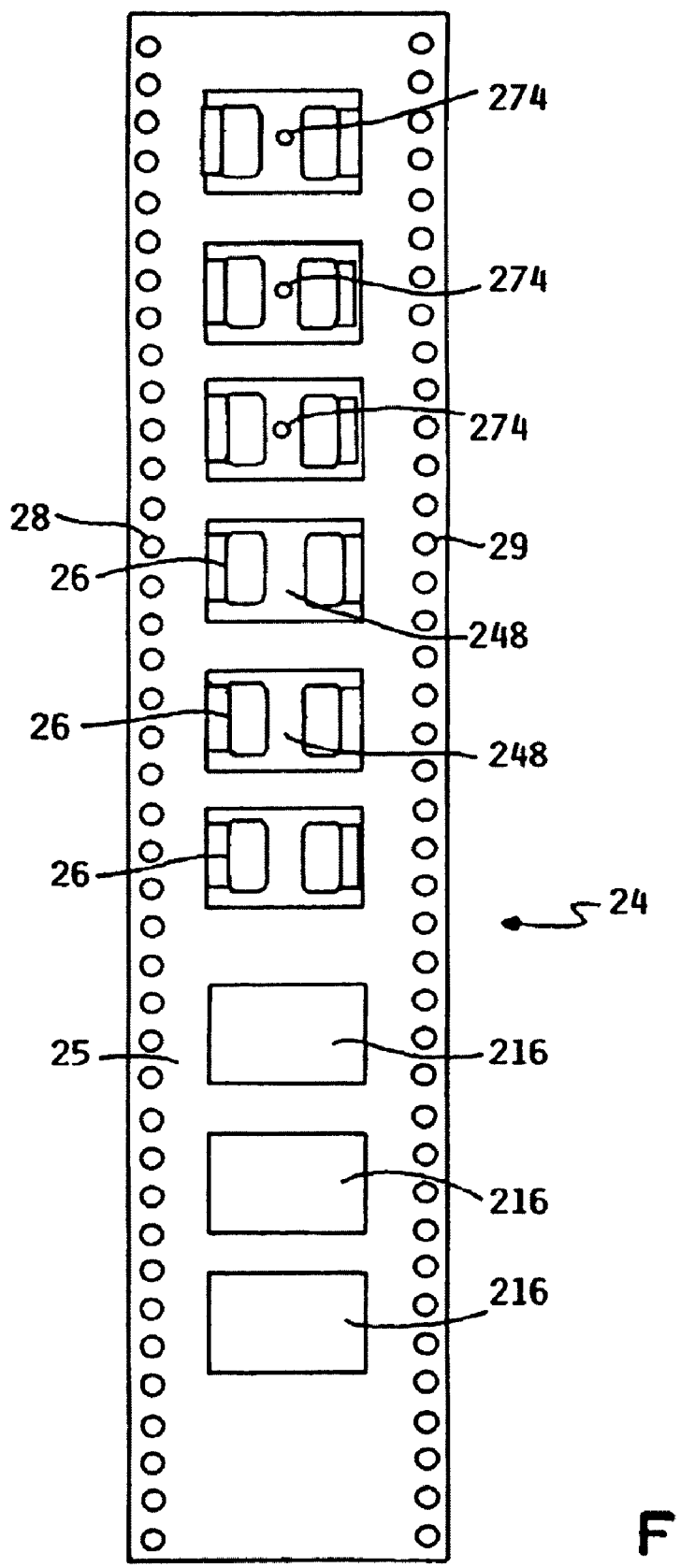
FIG. 3 is a view of a section of carrier tape at various stages of the embossing process.
Figure 4:
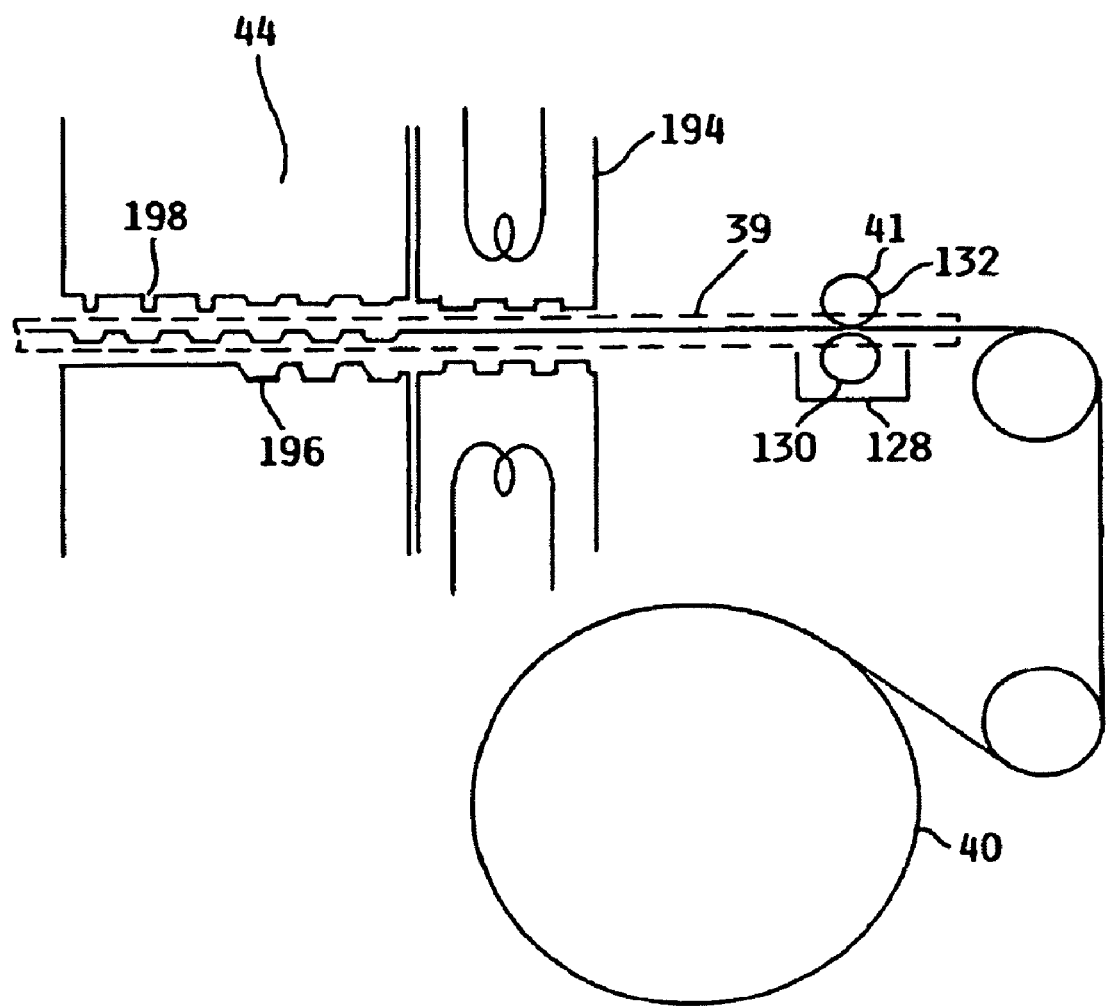
FIG. 4 is a schematic view of a tape path through the tape forming apparatus.

An exemplary carrier tape 24, as depicted in FIG. 3, includes a continuous strip of plastic material 25 with a series of uniformly spaced pockets 26 arranged linearly thereon. Typically, the carrier tape 24 has sprocket holes 28, 29, arranged in a uniformly spaced series along the lateral margins, thereof for moving the tape to processing equipment with sprockets. It will be readily appreciated that sprocket holes 28, 29, may be pre-punched in the carrier tape, or a punching apparatus may be added as a part of the apparatus described hereinbelow. Carrier tape 24 may be formed from a wide variety of suitable thermoplastic materials including polystyrene, polycarbonate, PETG, PET, and PVC. Any of these materials may be filled with suitable conductive material such as carbon fiber for static dissipation.

Integrated apparatus 30 generally includes carrier tape forming apparatus 32, and other processing equipment 33, such as filling apparatus 34 and sealing apparatus 36.

Figure 1:
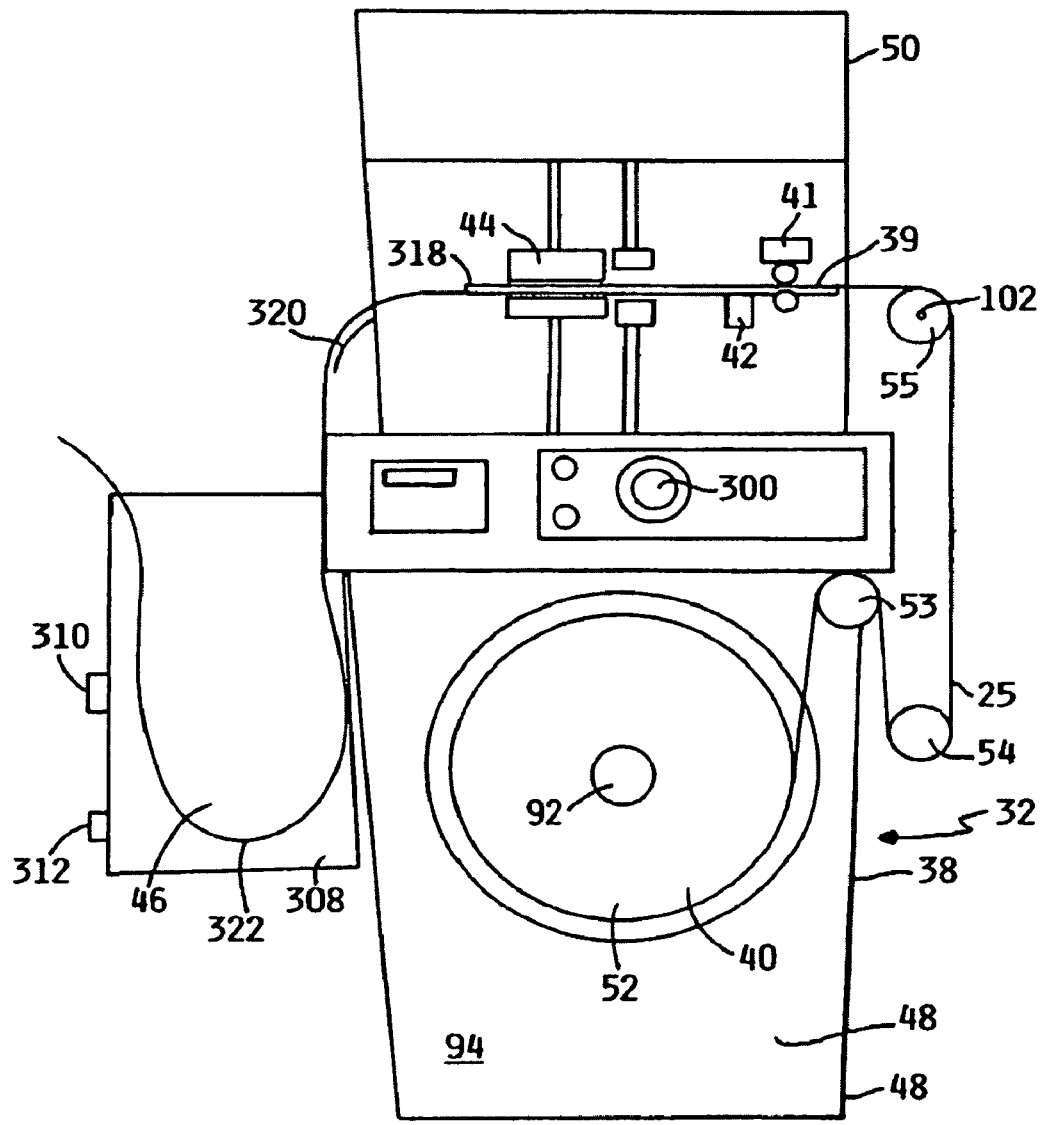
FIG. 1 is a front view of the carrier tape forming apparatus of the present invention.
Figure 2:
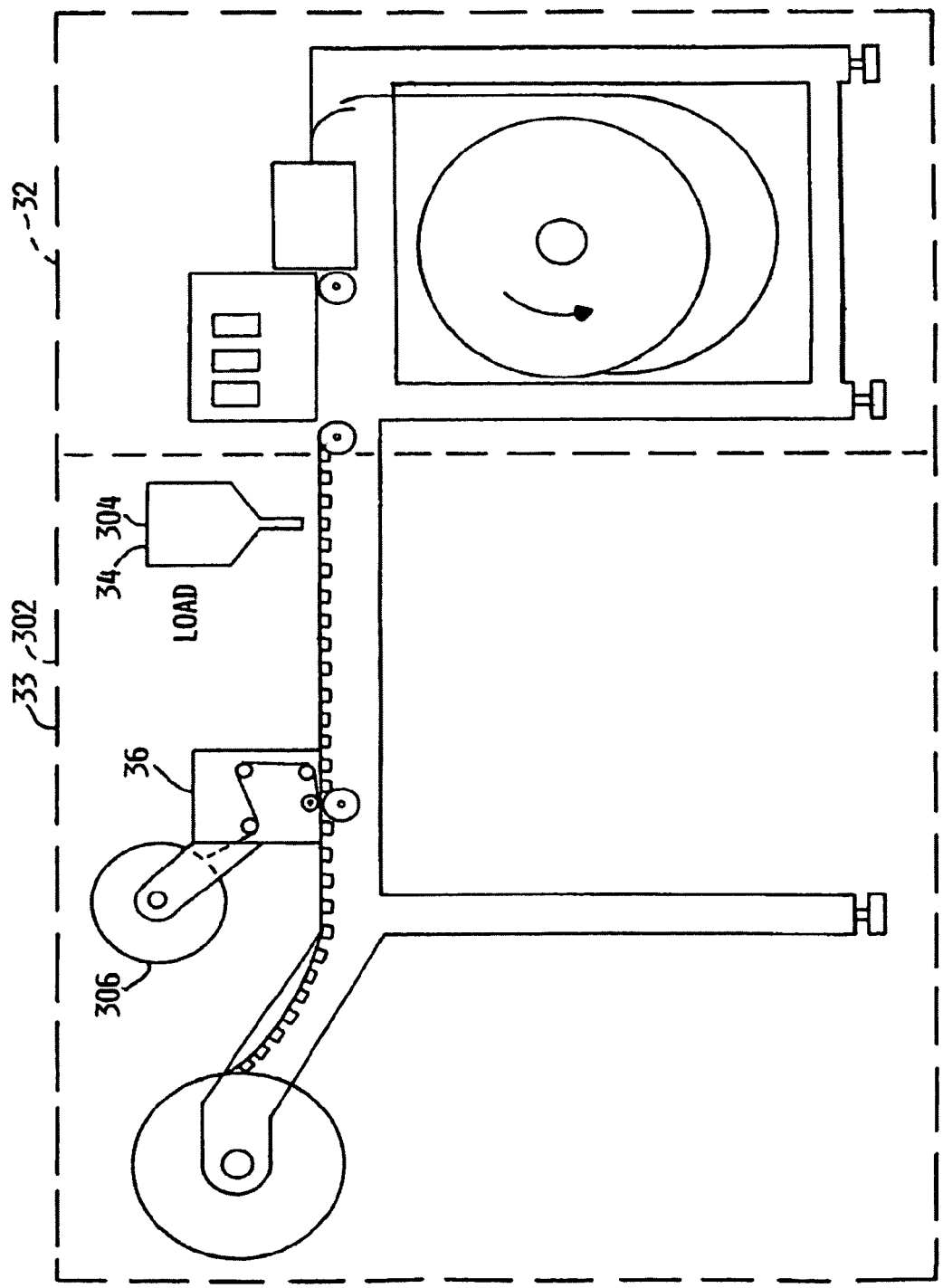
FIG. 2 is a simplified schematic view of an integrated carrier tape embossing and processing apparatus according to the present invention.

Referring to FIG. 1, carrier tape forming apparatus 32 generally includes a cabinet 38, a tape guide 39, a tape stock feed subsystem 40, a tape drive subsystem 41, a tape indexing subsystem 42, a forming subsystem 44, and a synchronizing subsystem 46. Cabinet 38 generally includes a lower housing 48 and an upper housing 50. Sheet guide 39 is mounted transversely in upper housing 50, and includes a lower guide plate 51a and an upper guide plate 51b secured together with fasteners. Lower guide plate 51a has a channel 51d formed therein and dimensioned so that a length of carrier tape 24 is receivable in channel 51d between lower guide plate 51a and upper guide plate 51b.

Tape stock feed subsystem 40 generally includes supply reel mechanism 52, feed rollers 53, 54, 55, and feed control mechanism 56. Supply reel mechanism 52 generally includes servo-motor (not shown), drive mechanism (not shown), shaft assembly (not shown), and tape reel 64.

Figure 7:
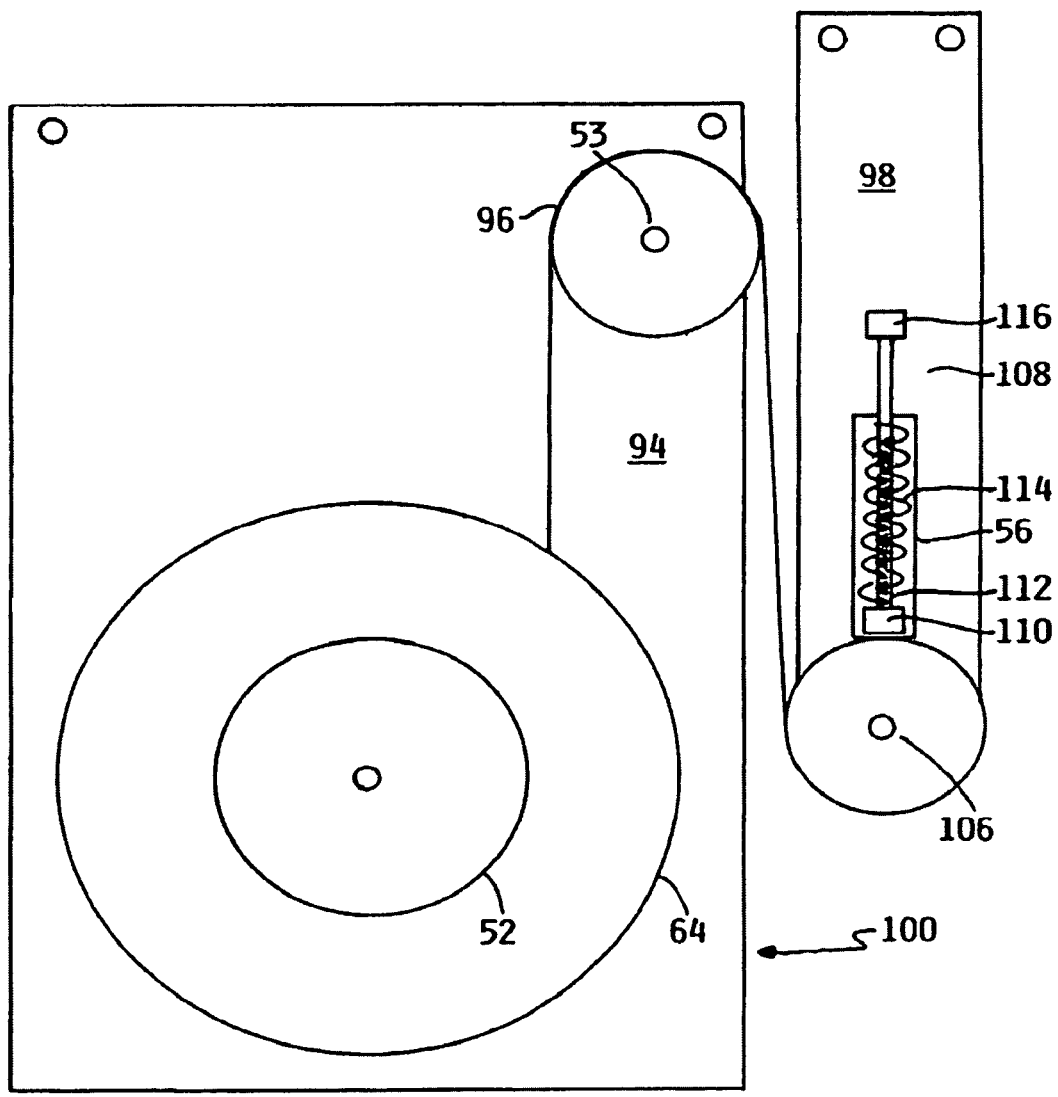
FIG. 7 is an elevational view of the feed rollers of the tape stock feed subsystem

Referring to FIG. 7, feed roller 53 rotates on axle 96, which is secured to front panel 94. Roller mount bracket 98 is secured to side 100 of cabinet 38. Feed roller 55 rotates on axle 102 at upper end of bracket 98. Feed roller 54 rotates on axle 106, which is secured at lower end of bracket 98, through feed control mechanism 56.

Feed control mechanism 56 generally includes slide block 110, plunger 112, compression spring 114, and linear potentiometer 116. Slide block 110 is slidably disposed in slot 118 in bracket 98, and is normally positioned at the bottom end 120 of slot 118 by gravity. Axle 106 is attached to slide block 110. Plunger 112 extends upwardly from slide block 110, through bracket 98 and connects with linear potentiometer 116. Compression spring 114 is disposed around plunger 112, and is adapted so that the upper end of the spring 114 contacts a part of the inner surface of slot 118 surrounding bore 122. Thus, when slide block 110 is moved upwardly in slot 118, plunger 112 actuates linear potentiometer 116, while spring 114 provides a downwardly directed biasing force directed against further upward travel of slide block 110. Linear potentiometer 116 is electrically connected so as to actuate servo-motor (not shown), which rotates tape reel 64. As tape reel 64 rotates, strip 25 is unrolled from reel 64.

In operation, tape 24 is threaded over feed roller 53, under feed roller 54 and over feed roller 55 as depicted in FIG. 1. Tape 24 is fed in predetermined increments by tape drive subsystem 41 as further described hereinbelow. As tape 24 is incrementally fed by tape drive subsystem 41, tape 24 tautens between rollers 53, 54, 55. Roller 54 is pulled upward, causing slide block 110 to slide within slot 118. Plunger 112, which is coupled with slide block 110 actuates linear potentiometer 116, thereby actuating servo-motor (not shown). Servo-motor (not shown) rotates tape reel 64, thereby feeding an additional length of tape. With the slack provided by the additional length of tape, feed roller 54 moves downward to it original position at the bottom of slot 118 urged by spring 114.

Figure 5:
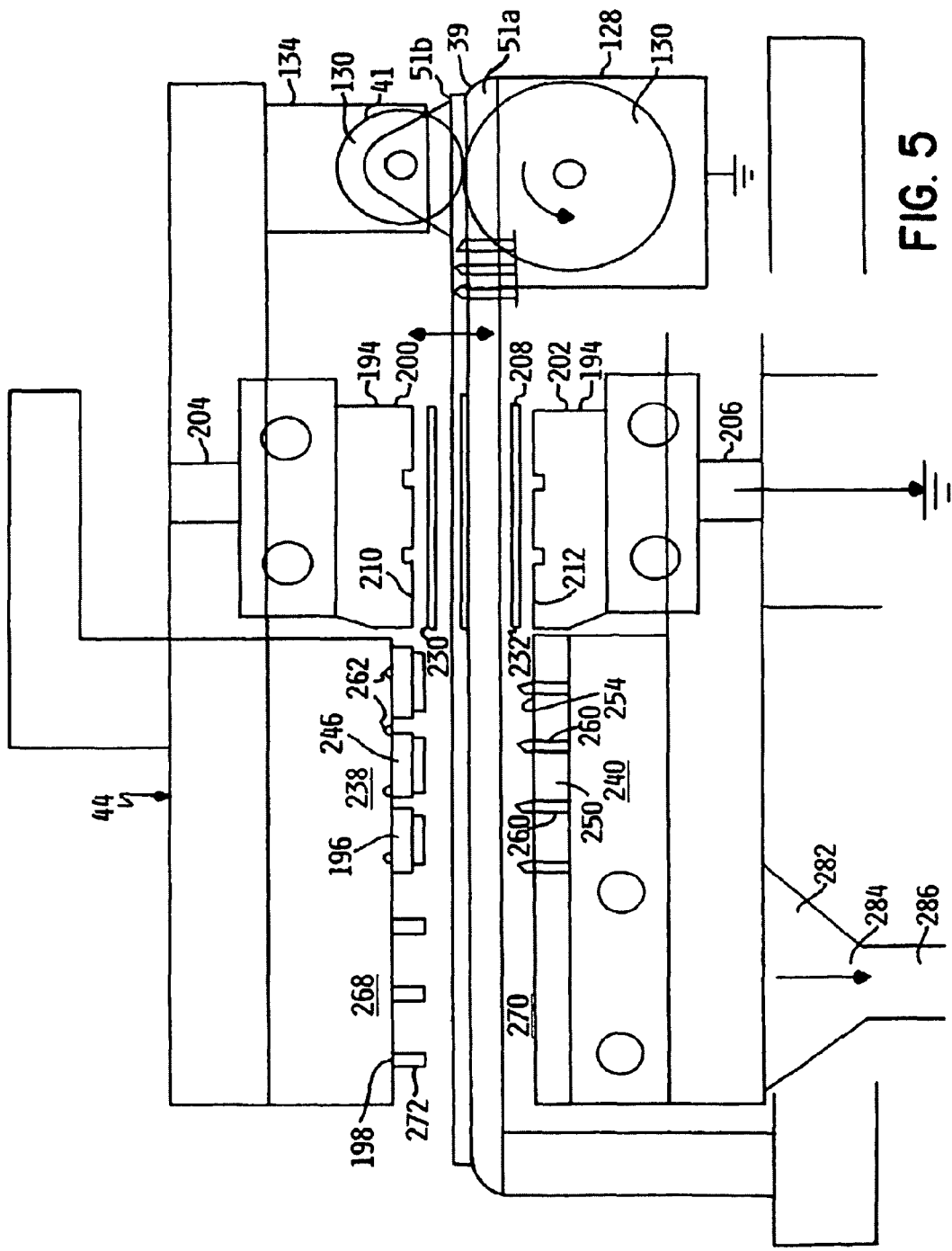
FIG. 5 is an elevational schematic view of tape forming portion of the apparatus depicting the sheet guide, tape drive subsystem, tape indexing subsystem, forming subsystem, and punching subsystem in accordance with the present invention.
Figure 6:
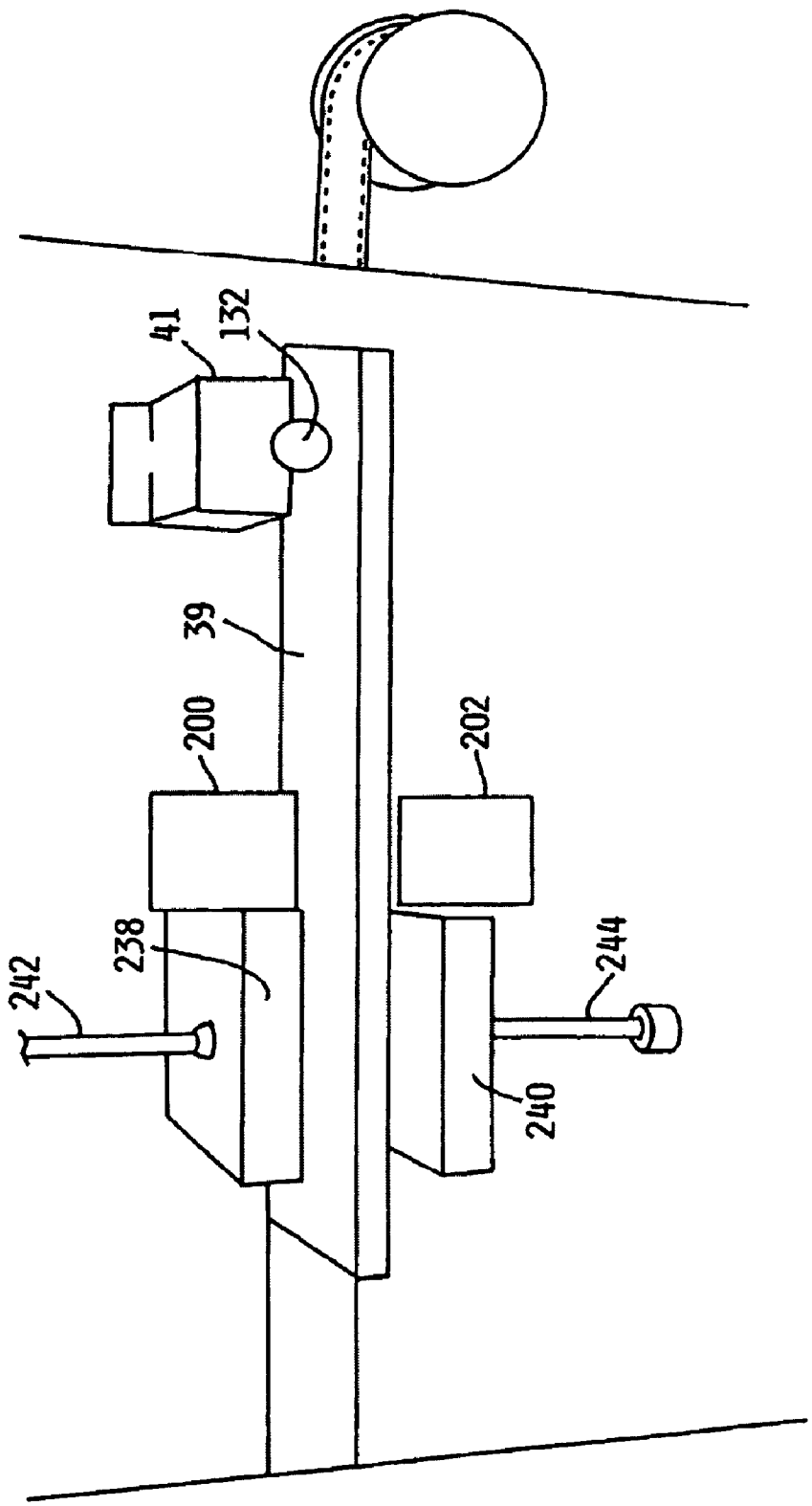
FIG. 6 is a perspective view of the view of tape forming portion of the apparatus.
Figure 9:
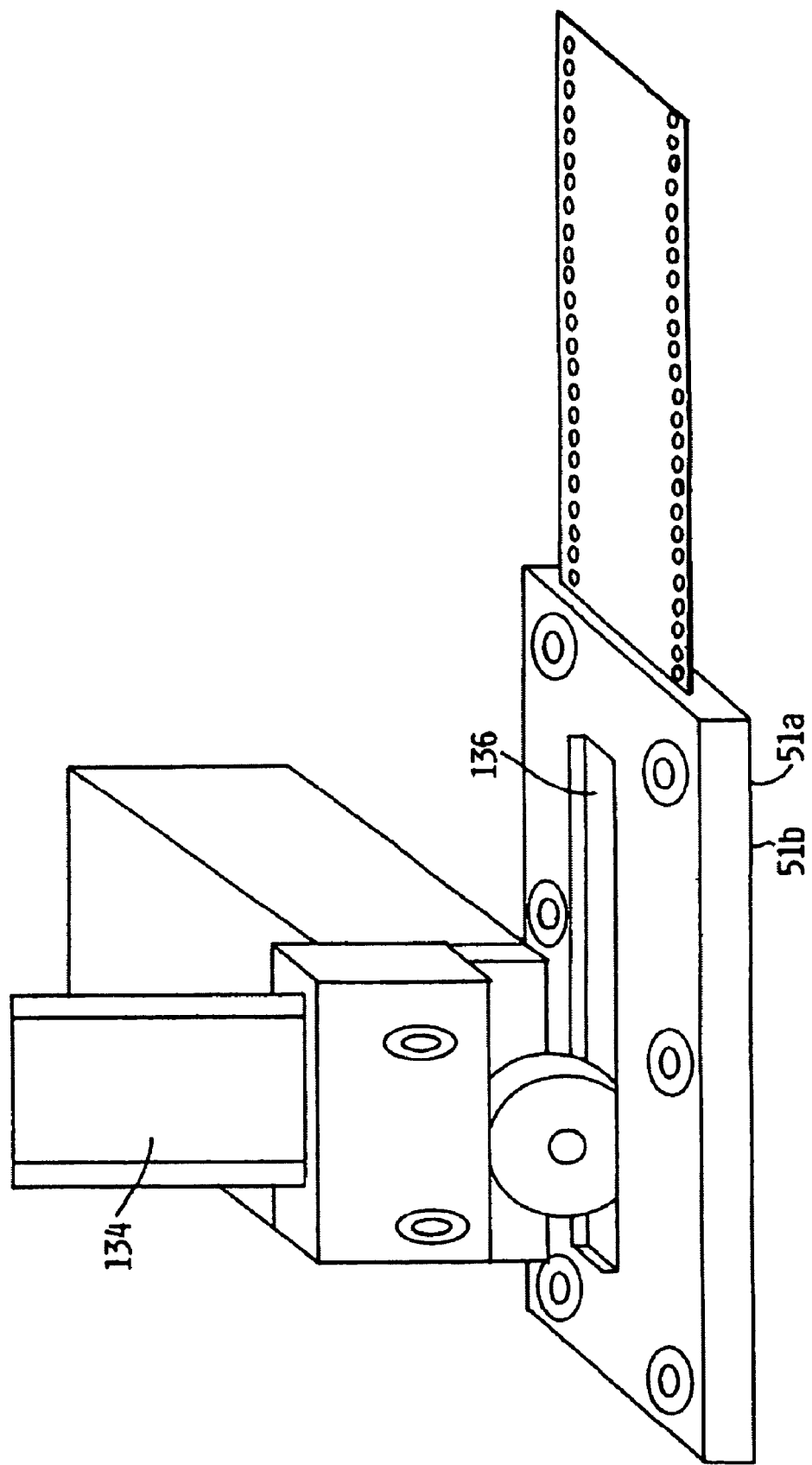
FIG. 9 is a perspective view of the friction roller of the tape drive subsystem engaged with the carrier tape.

Referring to FIGS. 5, 6 and 9, tape drive subsystem 41 generally includes servo-motor 128, drive roller 130, friction roller 132 and pneumatic actuator 134. Drive roller 130 and friction roller 132 contact tape 24 through slots 136 in guide plates 51a, 51b. Drive roller 130 is selectively rotatable with servo-motor 128 and is vertically fixed so that drive roller 130 is positioned in slot 136 in lower guide plate 51a. Friction roller 132 is coupled with pneumatic actuator 134 and is thereby selectively vertically positionable. When pneumatic actuator 134 is extended, friction roller 132 is extended into slot 136 in upper guide plate 51b, and tape 24 is pinched between drive roller 130 and friction roller 132. In this position, when servo-motor 128 is actuated, drive roller 130 propels tape 24 through sheet guide 39. When pneumatic actuator 134 is retracted, friction roller 132 is moved away from tape 24, thereby allowing tape 24 to be withdrawn or positioned in sheet guide 39 manually or with other mechanisms.

Figure 8:
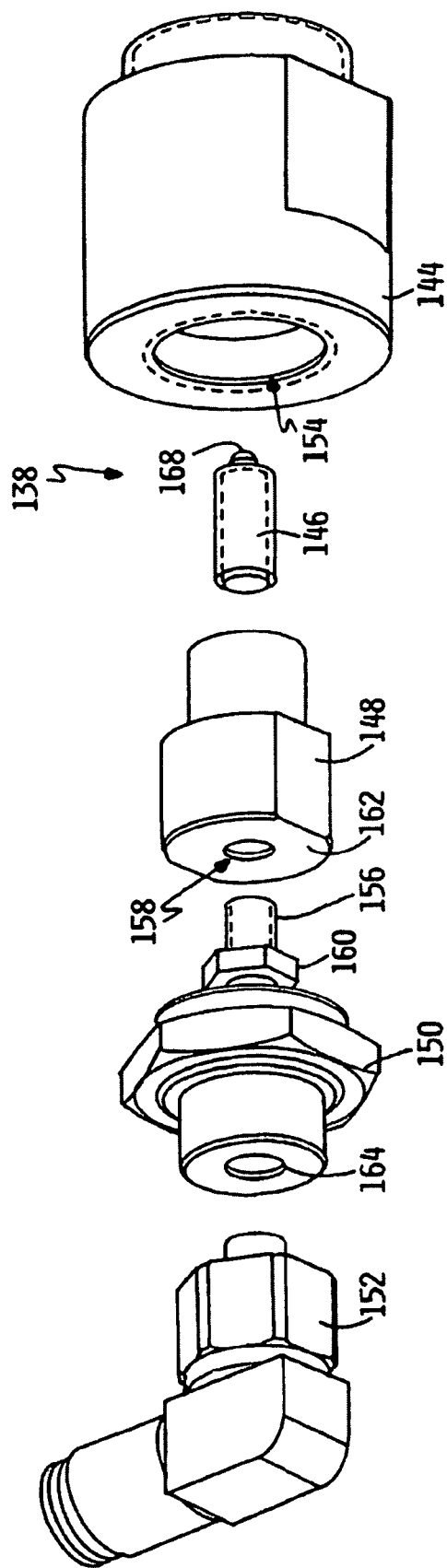
FIG. 8 is an exploded view of the ball detent mechanism of the tape indexing subsystem.
Figure 10:
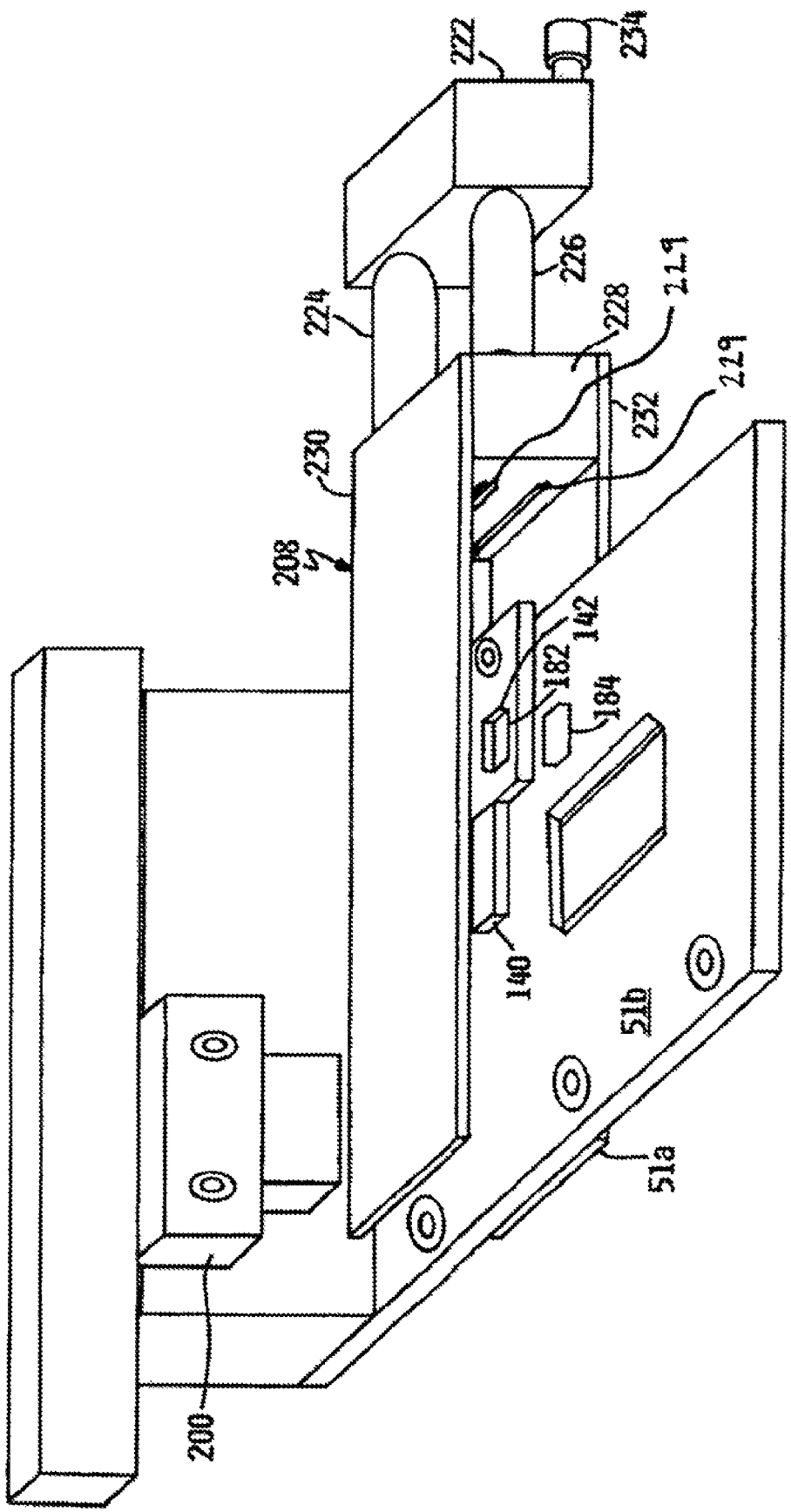
FIG. 10 is a perspective view of the sheet guide with various parts of the tape indexing subsystem and heating assembly.
Figure 12:
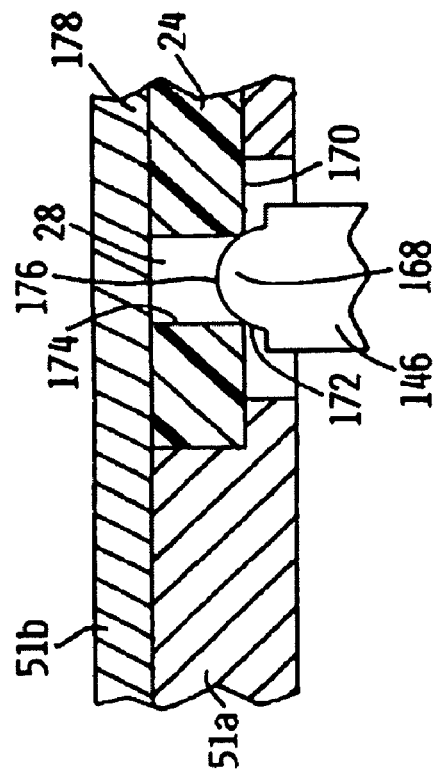
FIG. 12 is a cross-sectional view of the ball plunger of the ball detent mechanism engaged in a sprocket hole of the carrier tape.
Figure 11:
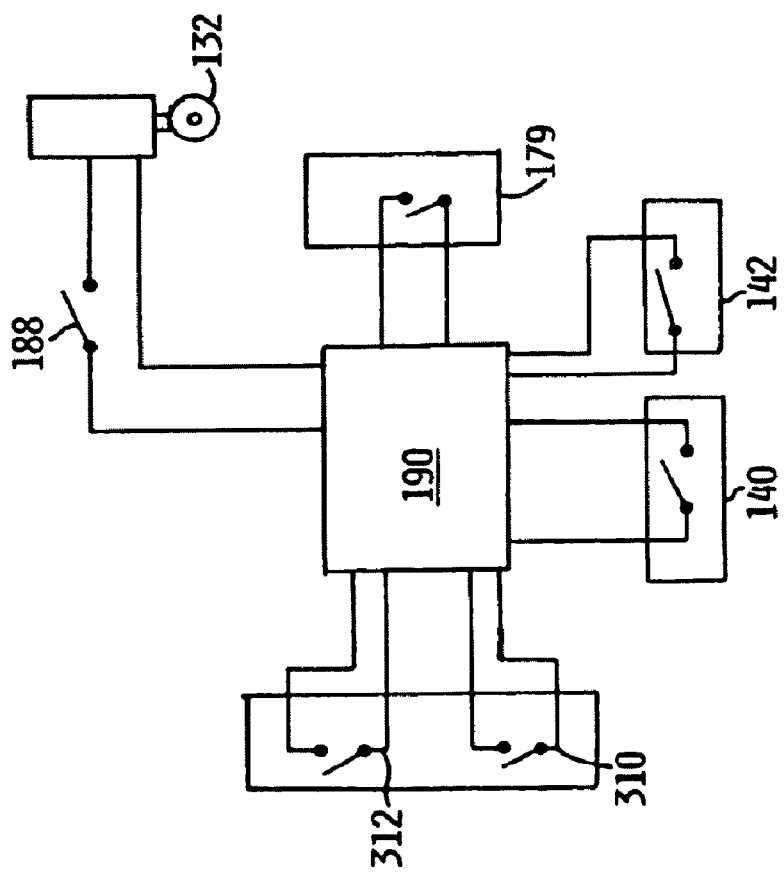
FIG. 11 is a simplified schematic of a processor and partial control system.

Referring to FIGS. 8 and 10, tape indexing subsystem 42 generally includes ball detent mechanism 138, tape end sensor 140, and positioning sensor 142. Ball detent mechanism 138 generally includes bushing 144, ball plunger 146, slide 148, pneumatic actuator 150, and air fitting 152. Slide 148 is slidably disposed within bore 154 of bushing 144. Shaft portion 156 of pneumatic actuator 150 is disposed through aperture 158 of slide 148 and engages with ball plunger 146. Shoulder portion 160 bears against end surface 162 of slide 148. Pneumatic actuator 150 is threadedly engaged in bore 154. Air fitting 152 connects with air inlet 164 of pneumatic actuator 150 to enable air to be supplied for actuating the mechanism.

Ball detent mechanism 138 is positioned through lower guide portion 51a so as to align with sprocket holes 28 when tape 24 is positioned in sheet guide 39. Ball portion 168 of ball plunger 146 is dimensioned so that when ball portion 168 is positioned in a sprocket hole 28 from the bottom side 170 of tape 24 as depicted in FIG. 10, the outer surface 172 snugly contacts the periphery 174 of the sprocket hole 28, but tip 176 does not extend completely through to the top side 178. Ball plunger 146 is extended into position for engagement with sprocket hole 28 by application of air pressure to air fitting 152. Pneumatic actuator 134 is adapted so that ball plunger 146 may move axially a slight distance against the air pressure. This in combination with the rounded shape of ball portion 168 enables tape 24 to be slid axially through sheet guide 39. Ball plunger 146 successively engages and slides out of each of sprocket holes 28, thereby providing a detent for positioning the tape. A sensor may be provided to indicate when ball plunger 146 is positioned in the fully extended position, thus indicating engagement in a sprocket hole 28. As will be apparent to those skilled in the art, sensing of the position of sprocket holes 28 for indexing may also be accomplished by a light sensor and a light source.

Tape end sensor 140, which may be a mechanical microswitch or any other suitable binary switching sensor, extends through an aperture through upper guide plate 51b. Sensor 140 is arranged so as to provide a binary signal indicating whether tape 24 is or is not present.

Positioning sensor 142 is arranged in alignment with sprocket holes 29 when tape 24 is positioned in sheet guide 39. Positioning sensor 142 is preferably a photo-sensor and has an upper portion 182 positioned in an aperture 184 in upper guide plate 51b and an opposing lower portion (not shown) positioned in an opposing aperture (not depicted) in lower guide plate 51a. Sensor 142 is arranged so as to provide a binary signal indicating whether one of sprocket holes 29 is or is not positioned between upper portion 182 and lower portion (not shown).

In operation, before tape 24 is inserted and positioned in sheet guide 39, ball detent mechanism 138 is actuated so that ball plunger 146 is extended into position for engagement with sprocket holes 28. Friction roller 132 is retracted so as to enable tape 24 to be freely inserted through sheet guide 39. Tape 24 is then inserted into channel 51d at proximal end 188 of sheet guide 39. As the tape is manually slid through sheet guide 39, ball portion 168 successively engages each of sprocket holes 28 providing a series of detents for manually registering the tape. When the leading edge of tape 24 reaches tape end sensor 140, the sensor provides a signal indicating that tape 24 is present. Tape 24 may then be manually positioned so that one of sprocket holes 29 is aligned between upper portion 182 and lower portion 186 of positioning sensor 142, and ball plunger 146 is engaged in one of sprocket holes 28 satisfying sensor 179. In this position, tape 24 is properly indexed to begin the forming process. Actuation of manual switch 188 causes friction roller 132 to extend, thereby pressing tape 24 against drive roller 130, and also removes air pressure from air fitting 152, thereby causing ball plunger 146 to retract from sprocket hole 28.

Tape end sensor 140 and positioning sensor 142 are preferably connected through a processor 190, which is arranged so as to provide appropriate prompts to an operator when tape 24 is properly positioned. These prompts may include visual indicators such an indicator lights. In addition, processor 190 may be arranged so as to enable manual switch 188 for actuating friction roller 132 only when sensors 140, 142, 179, are all satisfied.

Referring to FIG. 5, forming subsystem 44 generally includes a heating assembly 194, a forming assembly 196, and a punching assembly 198. Heating assembly 194 generally includes a pair of heating blocks 200, 202, pneumatic actuators 204, 206, and retractable heat shield assembly 208. Heating blocks 200, 202, are opposingly positioned above and below sheet guide 39. Each heating block 200, 202, has heating pads 210, 212, corresponding in shape and dimensions to the outline of the pockets 26 in carrier tape 24. Upper and lower guide plates 51b, 51a, each have an aperture through which heating pads 210, 212, are extendable to contact tape 24. Pneumatic actuators 204, 206, are coupled to heating blocks 200, 202, and are arranged to move heating blocks 200, 202, vertically. When pneumatic actuators 204, 206 are extended by application of air pressure, tape 24 is pinched between heating pads 210, 212, causing regions 216 of tape 24 corresponding to the outline of pocket 26 to be heated to a forming temperature. Each pneumatic actuator 204, 206, may have resilient return mechanism such as a spring (not depicted) to automatically retract the actuator and move heating blocks 200, 202, away from tape, 24 when air pressure is removed.

Heating blocks 200, 202, may each be heated with a suitable heating element, such as an electric heater, for maintaining the block at a suitable temperature for embossing strip 25. A thermocouple may be provided in each heating block 200, 202, and connected with a visual temperature readout, to enable operator monitoring of forming temperature. The forming temperature may be varied depending on the tape material and dimensions used. It has been found that with thermoplastic material, a forming temperature of 350 degrees Fahrenheit yields best results.

It will be readily appreciated that other heating mechanisms may be substituted for the positionable contact heaters described above. For example, radiant heating elements with a limited area of tape exposure and which may be fixed in position, could be used in conjunction with the heat shield mechanisms described herein below.

Retractable heat shield assembly 208 generally includes a pneumatic actuator 222, a pair of guide shafts 224, 226, a body portion 228, and a pair of heat shields 230, 232. Heat shields 230, 232 are mounted parallel and spaced apart on body portion 228 so as to be interposable between the heating pads 210, 212, and each side of tape 24 when heating blocks 200, 202, are retracted. Pneumatic actuator 222 is arranged to selectively slide body portion 228 on guide shafts 224, 226, toward and away from sheet guide 39 to interpose the shields 230, 232.

Figure 13:
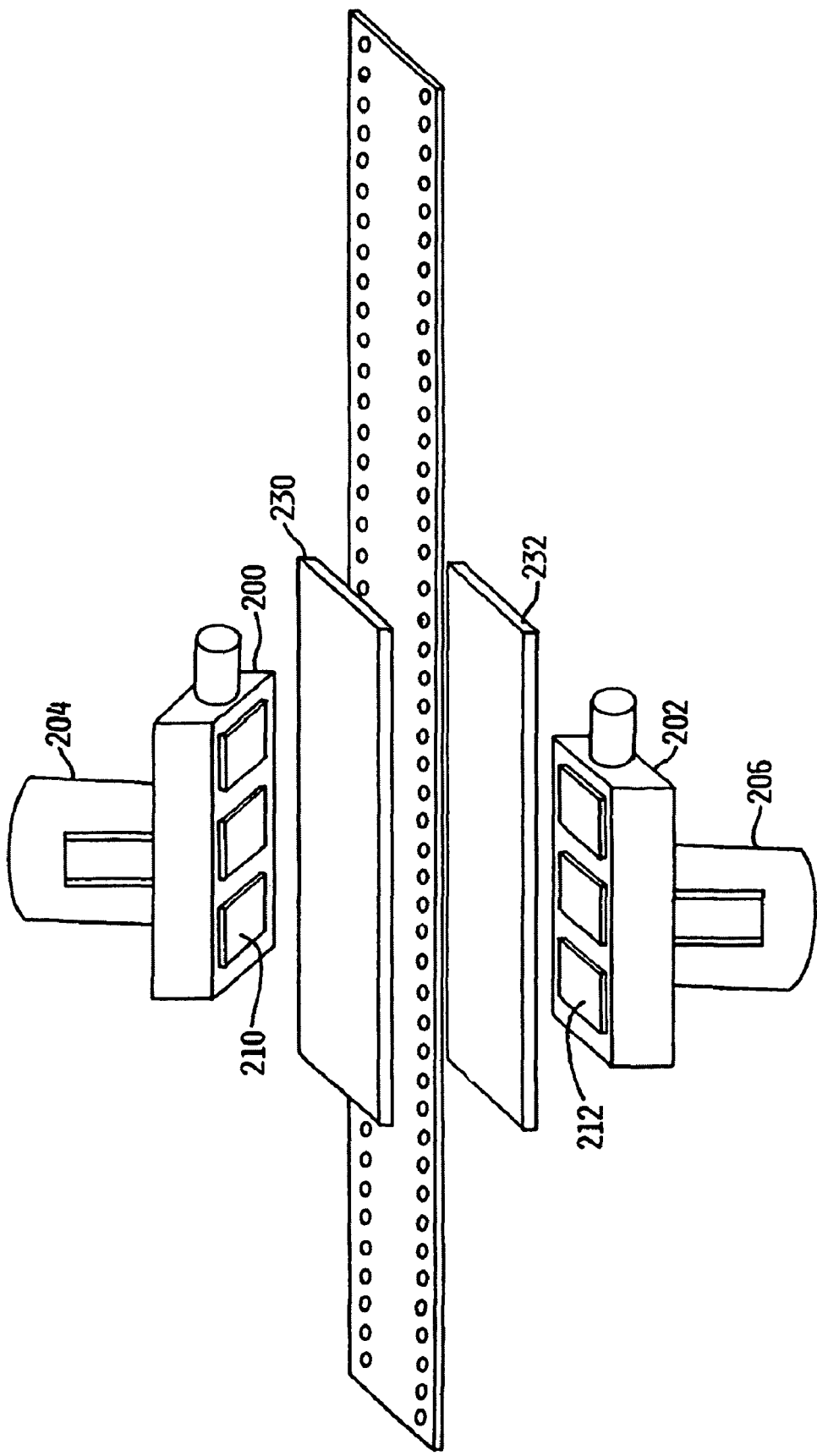
FIG. 13 is a schematic perspective view of the heating assembly with retractable heat shield assembly extended.
Figure 14:
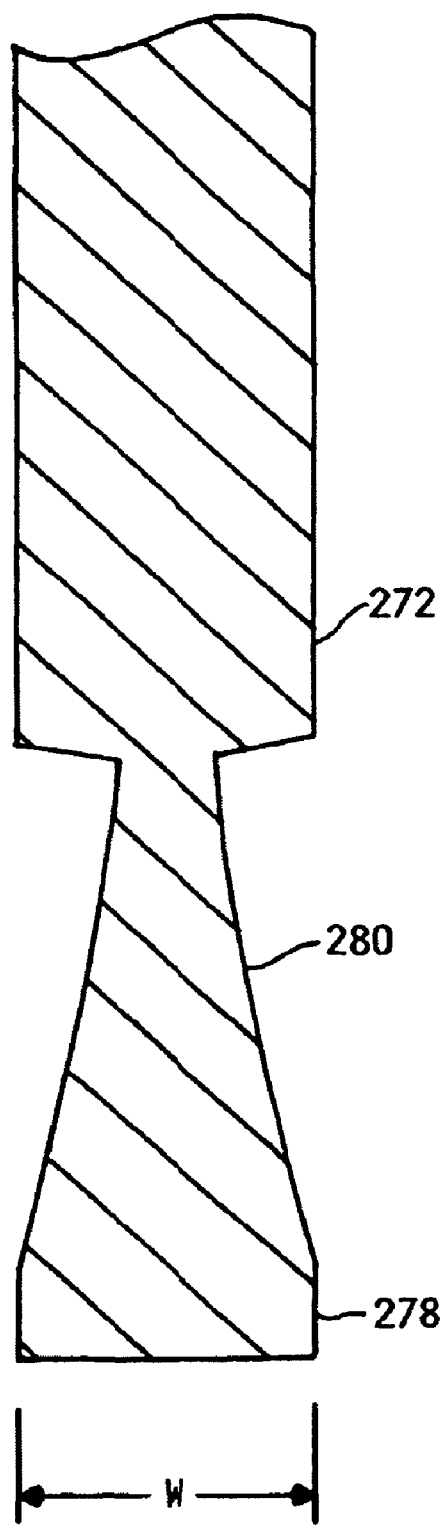
FIG. 14 is a cross-sectional view of a punch in accordance with the present invention.

Heat shields 230, 232, as depicted in FIGS. 10 and 13, may be made from any suitable heat insulative material such as phenolic plastic. In the depicted embodiment, guide shaft 226 is hollow and connects with a plenum (not depicted) in body portion 228. Pressurized air is provided to guide shaft 226 through fitting 234, thereby providing air to the plenum. A diffuser slot 229 is provided in body portion 228 and is arranged so as to direct air from the plenum across one or more of surfaces 236 of heat shields 230, 232, so as to prevent heat buildup and consequent loss of effectiveness of the shields.

Retractable heat shield assembly 208 enables the forming process to be paused at will, without the need for extended equipment warm-up times and without incurring heat damage to the tape 24 during a pause in processing due to radiant or convective heat transfer from heating blocks 200, 202. It is anticipated that other means could also be used to shield tape 24 form heat damage by heating blocks 210, 212, during a pause period. For example, heat shields 230, 232, could be replaced with an air curtain produced by diffuser nozzles or slots arranged to direct relatively high velocity streams of air between the tape 24 and the heating pads 210, 212.

Forming assembly 196 generally includes a pair of opposing mold blocks 238, 240, and pneumatic cylinders 242, 244. Mold block 238 has male mold portions, each shaped correspondingly to the inside surface 248 of pocket 26. Mold block 240 has a corresponding female mold portion for each male mold portion. Mold blocks 238, 240, are each coupled to one of pneumatic cylinders 242, 244, so as to be selectively extendable through apertures in upper and lower guide plates 51*b*, 51*a*, for forming pockets 26 in tape 24. A resilient member, such as a coil spring (not depicted) may be including in the coupling between mold blocks 238, 240, and pneumatic cylinders 242, 244, so as to introduce a slight amount of resilience in the mechanism to account for varying thicknesses of tape 24. Mold block 240 may have an air passage formed therein with an opening into female mold portion. This air passage is connectable with a supply of pressurized air, and serves as a means of introducing pressurized air into female mold portion as further explained hereinbelow. Mold blocks 238, 240 may have internal heating elements for maintaining the blocks at a desired temperature above ambient. Thermocouples may be provided in mold blocks 238, 240, connected with visual temperature indicators to provide temperature information to an operator.

Mold block 240 has a number of pilot pins 260 adapted to fit into corresponding apertures 262 in mold block 238. Pilot pins 260 are adapted and arranged to snugly slip-fit through sprocket holes 28, 29, when mold blocks 238, 240, are brought together to form pockets 26. Further, each mold block 238, 240, may have an alignment pin adapted to fit into an aperture in sheet guide 39, so as to provide lateral stability and accurate positioning for the forming assembly.

Punching assembly 198 generally includes upper and lower blocks 268, 270, respectively and punch pins 272. Upper and lower blocks 268, 270, may be integral with mold blocks 238, 240, respectively, and are thus moved together and apart with pneumatic cylinders 242, 244 in conjunction with mold blocks 238, 240. Each punch pin 272 is positioned so as to punch a hole 274 in the same position in the bottom 276 of each pocket 26. Each pin 272 has a head portion 278 of a slightly larger diameter than the desired diameter of the finished hole 274. A portion 280 of punch pin 272 immediately adjacent head portion 278 has a diameter slightly smaller than the diameter of hole 274. Lower block 270 has a recessed portion corresponding with each pin 272. When blocks 268 and 270 are brought together, the head portion 278 of each pin 272 pierces the bottom 276 of a pocket 26, thereby forming hole 274 and cutting away a chad. The head portion 278 is pushed completely through so that portion 280 of the pin extends through hole 274. After head portion 278 passes through, hole 274 closes to a slightly smaller diameter than head portion 278 due to the natural resilience of the tape material. The smaller diameter of portion 280 enables hole 274 to close slightly without puckering around pin 272, thus preventing undesirable distortion of pocket 26 from the puckering itself and from sticking to pin 272 during withdrawal.

Recessed portion 282 may have an opening 284 formed therein connected with a vacuum line 286 for collecting the chads. In the depicted embodiment, vacuum line 286 is connected with a vacuum venturi apparatus (not shown), itself connected with a source of compressed air. The collected chads are carried through line and collected in a bag. Proximity sensor is arranged so as to sense when bag is nearing a full condition, and may be connected with an alarm to prompt operator attention and/or an interlock to pause machine operation until the bag is emptied.

In operation, with tape 24 indexed in sheet guide 39 as previously described with drive roller 130 and friction roller 132 pinching tape 24 therebetween, servo-motor 128 is actuated to drive a predetermined increment of tape 24 into position in sheet guide 39 between heating pads 210, 212. Pneumatic actuators 204, 206 are momentarily actuated, bringing heating pads 210, 212, into contact with each side of tape 24, thus heating only the regions 296 of the tape to be formed into pocket 26. Heating pads 210, 212 are maintained in contact with the regions 216 for a sufficient time for heating the tape to a thermoplastic forming temperature. Air pressure is then released from the pneumatic actuators 204, 206, moving heating blocks 200, 202 apart.

Servo-motor 128 is actuated again to drive the tape 24 so that regions 216 are precisely aligned between male mold portions 246 and female mold portions 250. Pneumatic cylinders 242, 244, are actuated to bring mold blocks 238, 240 together, thereby forming portions 216 into pockets 26 between male mold portions 246 and female mold portions 250. As the mold blocks 238, 240, are brought together, pilot pins 260 slip though sprocket holes 28, 29, thereby holding and precisely positioning tape 24. Simultaneously, friction roller 132 is retracted, so that pilot pins 260 are the sole means of positioning tape 24 during forming, thereby eliminating any accumulated tolerance runout resulting from tape indexing subsystem 42. Just as male mold portions 246 and female mold portions 250 close upon regions 216, air is supplied through opening in female mold portion 250 so as to force region 216 against male mold portion 246. In this way, any particulates or other impurities on either mold surface will cause a distortion in the less critical exterior side of the pocket 26, rather than the much more dimensionally critical interior side 298 of the pocket, which has the positioning contact surfaces for a device disposed in pocket 26. It will be readily appreciated, however, that in an alternative embodiment, the tape may be formed against the female mold surface, with pressurized air or gas introduced from the male mold side.

Once pocket molding is complete, pneumatic actuator 134 is again actuated so as to bring friction roller into contact with tape 24, and mold blocks 238, 240, are separated, thereby withdrawing pilot pins 260 from sprocket holes 28, 29, and retracting male and female portions 246, 250. Servo-motor 128 is actuated to drive tape 24 forward so that the newly-formed pockets are positioned under punch pins 272. Blocks 268, 270, are then brought together causing punch pins 272 to punch holes 274 each pocket bottom 276.

As will be appreciated, since blocks 268, 270 are integral with mold blocks 238, 240, the forming and punching processes described above are performed on adjacent portions of tape 24 simultaneously. Thus, when newly formed pockets 26 are being punched with holes 274 in punching assembly 198, an immediately adjacent section of tape is having pockets 26 formed therein in forming assembly 196, and a section adjacent to that section is being heated in heating assembly 194. As will also be appreciated, tape 24 is positioned by pilot pins 260 whenever mold blocks 238, 240, are closed. Thus, pilot pins 260 position tape 24 during the punching and heating processes as well as during the forming process, since those processes are occurring simultaneously on different sections of tape 24.

Figure 15:
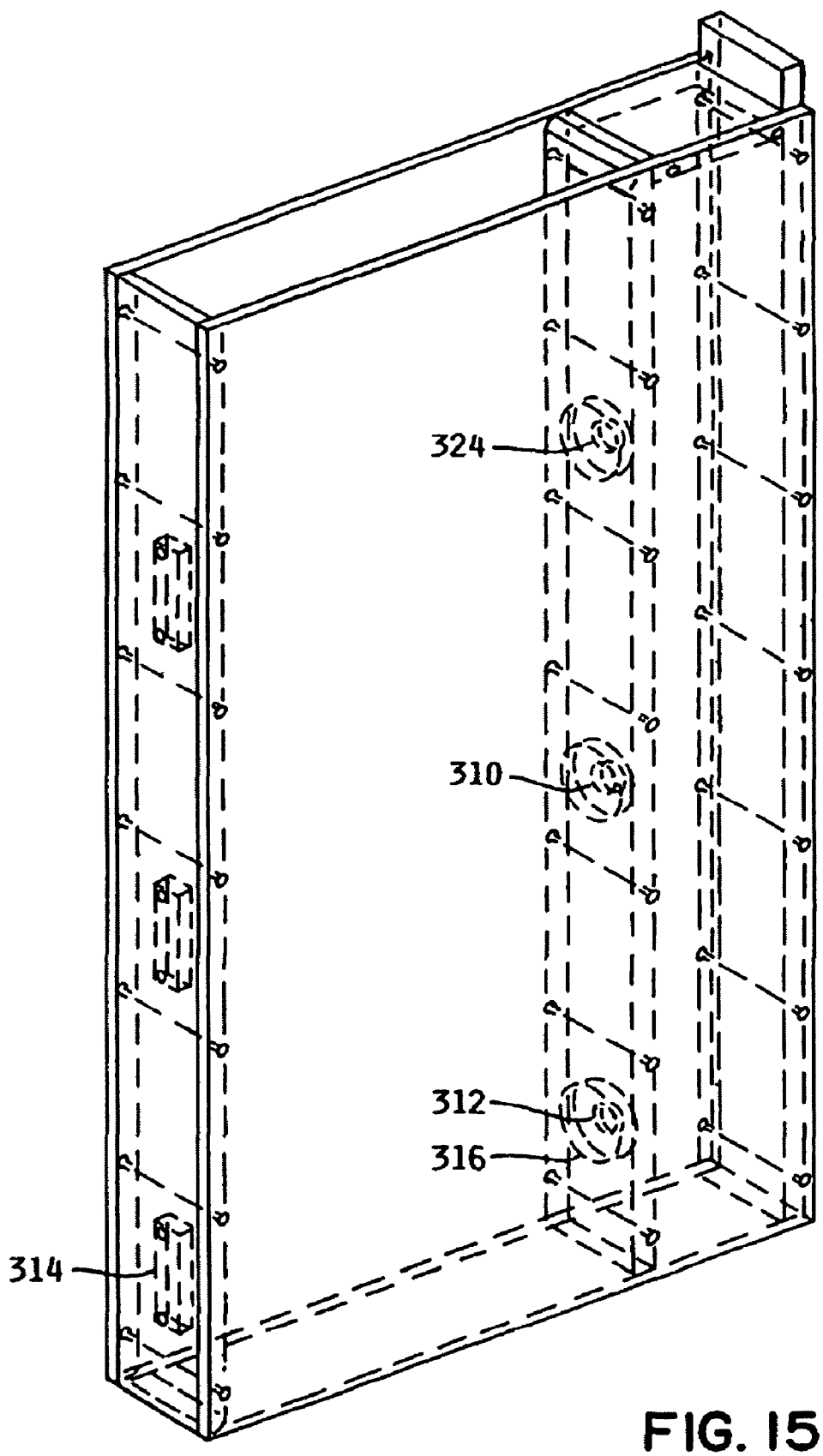
FIG. 15 is a perspective view of one embodiment of the synchronizing subsystem.
Figure 16:
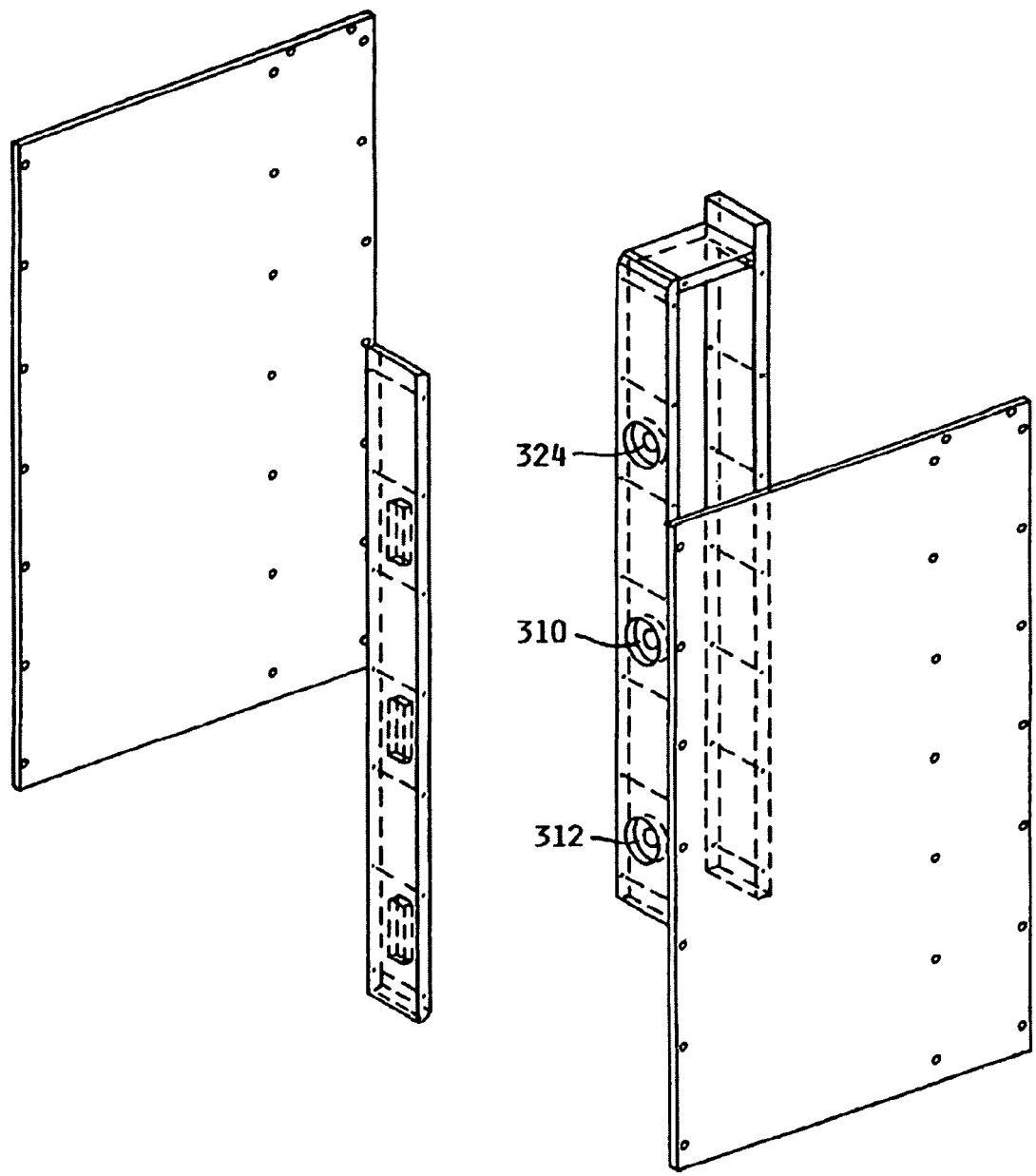
FIG. 16 is an exploded view of an alternative embodiment of a synchronizing subsystem.

A unique aspect of the invention is the pause mode enabled by retractable heat shield assembly 208. At any time, the forming process may be paused by actuating a manual control or with a signal from synchronizing subsystem 46 as will be further explained hereinbelow. In the pause mode, male mold portions 246 and female mold portions 250 are held in position in contact with tape 24 and with pilot pins 260 through sprocket holes 28, 29, so as to securely retain tape 24 in precise position. Heating blocks 200, 202, are retracted, but are kept at temperature. Heat shield assembly 208 is extended so that heat shields 230, 232, are interposed between the heating blocks 200, 202, and the tape 24. The heat shields 230, 232, prevent any heat damage from occurring to tape 24 during pausing. When desired, the process can be restarted, by retracting heat shield assembly 208 and resuming the other steps of the process as before. Referring to FIGS. 1, 15 and 16, synchronizing subsystem 46 is arranged between carrier tape forming apparatus 32 and one or more pieces of processing equipment 302, which may include a pick-and-place component fill apparatus 304 and a cover tape sealing apparatus 306. Pick-and place component fill apparatus 304 and cover tape sealing apparatus 306 may be any such devices that are commonly commercially available for the purpose. Synchronizing subsystem 46 generally includes a housing 308, an upper sensor pair 310, and a lower sensor pair 312. Each upper and lower sensor pair 310, 312, may include a photo sensor 314 and a reflector 316.

As tape 24 with formed pockets 26 emerges from distal end 318 of sheet guide 39, the bottom of the tape 24 slides along downwardly curved guide 320, forming a loop 322 in housing 308. Upper and lower sensor pairs 310Q, 312, are arranged so as to provide a signal indicating the presence of loop 322 between the photo sensor 314 and the reflector 316 of the pair. The signals from sensor pairs 310, 312 are provided to processor 190. When loop 322 reaches lower sensor pair 312, indicating the tape production rate of carrier tape forming apparatus 32 is exceeding the input rate of processing equipment 302, processor 190 initiates the pause mode in carrier tape forming apparatus 32 as described above. With carrier tape forming apparatus 32 paused and as tape fill apparatus 302 accepts tape, loop 322 rises in housing 308. When loop 322 clears upper sensor pair 310, processor 190 restarts carrier tape forming apparatus 32. Thus, the tape production rate of carrier tape forming apparatus 32 is adjusted to substantially equal the tape input rate of equipment 302.

In an embodiment of synchronizing subsystem 46 as depicted in FIGS. 15 and 16, an additional sensor pair 324 is provided above sensor pairs 310, 312. Sensor pair 324 may be connected with a suitable control system of tape fill apparatus 302 to provide a means for automatically stopping the tape fill apparatus 302 in the event of a problem with carrier tape forming apparatus 32.

Of course, it will be appreciated that processor 190 may also provide prompts or signals to an operator based on the signals from sensor pairs 310, 312, and the status of the apparatus. These prompts or signals may be provided in the form of any suitable visual and/or audible alarm indicators, such as lights, buzzers, sirens, voice prompts, or the like.

Figure 17:
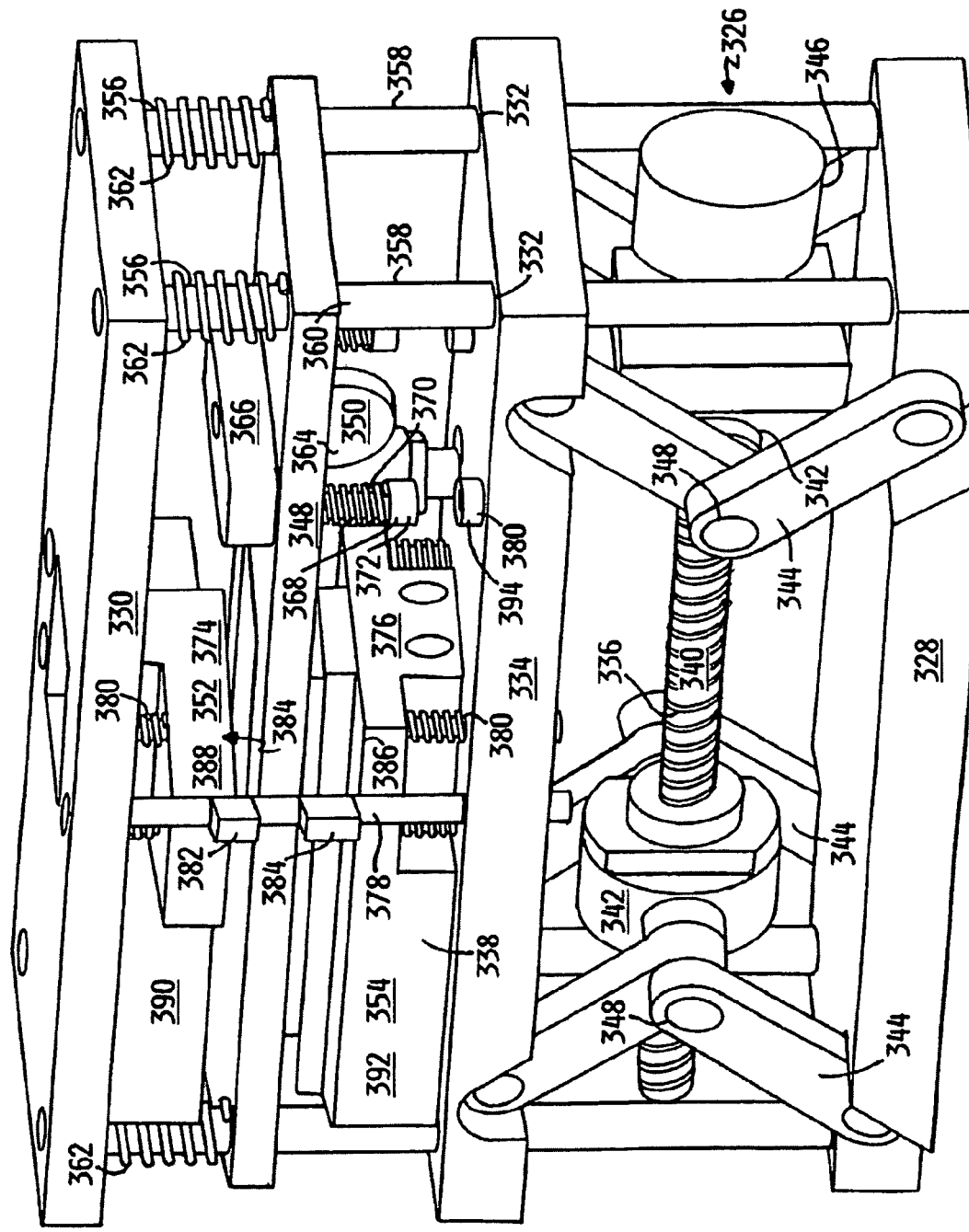
FIG. 17 is a perspective view of an alternative embodiment of the apparatus.

An alternative embodiment of a carrier tape forming apparatus 32 is depicted in FIG. 17, in which a mechanical actuation mechanism 326 replaces the various pneumatic actuators of the previously described embodiment. Mechanical actuation mechanism 326 generally includes base 328, top 330, spacers 332, slide plate 334, ball screw assembly 336, and tape handling assembly 338. Base 328 and top 330 are fixed together and spaced apart with spacers 332. Slide plate 334 is axially slidable on spacers 332.

Ball screw assembly 336 generally includes threaded shaft 340, transfer members 342, toggle linkages 344, and drive connection 346. Threaded shaft 340 is retained by drive connection 346, so that rotation applied to drive connection 346 by a suitable power source such as a servo-motor (not depicted) causes threaded shaft 340 to rotate, but not to translate axially. Transfer members 342 are threadedly engaged on threaded shaft 340, and move axially in opposite directions with rotation of threaded shaft 340. Transfer members 342 are connected at the center pivots 348 of toggle linkages 344. Thus, when threaded shaft 340 is rotated, transfer members 342 move axially on threaded shaft 340, causing toggle linkages 344 to extend and retract, thereby sliding slide plate 334 vertically on spacers 332.

Tape handling assembly 338 generally includes sheet guide 348, tape drive assembly 350, tape heater assembly 352, and tape forming and punching assembly 354. Sheet guide 348 is vertically slidable on upper portions 356 of spacers 332, which have a smaller diameter than lower portions 358. Sheet guide 348 rests on the shoulders 360 of lower portions 358. Compression springs 362 are disposed around upper portions 356 as depicted, and provide a downwardly directed biasing force to sheet guide 348.

Tape drive assembly 350 generally includes a drive roller 364, a friction roller (not depicted) disposed inside upper block 366, slide pins 368, and compression springs 370. Drive roller 364 is rotationally driven by a servo-motor (not depicted) and is vertically fixed in position on the underside of sheet guide 348 so that drive roller 364 is positioned to engage the underside of tape 24 disposed in sheet guide 348. Upper block 366 rests on the top side of sheet guide 348 so that the friction roller disposed inside contacts the top side of tape 24. Slide pins 368 are slidably disposed in apertures in sheet guide 348 and are attached to upper block 366. Compression springs 370 bear against head portion 372 of slide pins 368 and the underside of sheet guide 348, biasing upper block 366 downward so that tape 24 is pinched between drive roller 364 and the friction roller inside upper block 366.

Tape heater assembly 352 generally includes upper and lower heater blocks 374, 376, and wedge assembly 378. Heater blocks 374, 376 are resiliently mounted to top 330 and slide plate 334, respectively, with coil springs 380. Once again, each heater block has internal heating means to maintain the heater block at a desired forming temperature. Wedge assembly 378 is rotatably mounted in a socket (not depicted) in top 330, and is rotatable and slidable in an aperture (not depicted) in slide plate 334. Wedge assembly 378 has a pair of projections 382, 384, which are dimensioned to fit between surfaces 386, 388, of each heater block 374, 376, and sheet guide 348 when slide plate 334 is positioned at its lower travel limit as depicted. Wedge assembly 378 is rotatable by a suitable power source such as a servo-motor (not depicted). Tape forming and punching assembly 354 generally includes a pair of integral mold and punch blocks 390, 392, as described above for the previous embodiment, including pilot pins for engaging and holding the sprocket holes of tape 24. Integral mold and punch blocks 390, 392, are rigidly mounted to top 330 and slide plate 334.

In operation, with slide plate 334 at the lower limit of its travel, tape 24 is indexed in sheet guide 348 as previously described. To initiate the forming process, drive roller 364 is driven so as to propel a predetermined length of tape through sheet guide 348 to a position between heater blocks 374, 376. A rotational force is provided to drive connection 346, rotating threaded shaft 340 and causing transfer members 342 to translate on threaded shaft 340. The translation of transfer members 342 causes toggle linkages 344 to extend, thereby lifting slide plate 334 upward. As slide plate 334 is lifted further upward, surfaces of integral mold and punch block 392 contacts the underside of sheet guide 348, lifting it upward against the bias of compression springs 362. When toggle linkages 344 are fully extended, slide plate 334 and sheet guide 348 are at the top limit of their ranges of travel, and integral mold and punch blocks 390, 392, are firmly closed on tape 24, as are heater blocks 374, 376.

As integral mold and punch blocks 390, 392, are closed, pilot pins extend through sprocket holes in tape 24 as in the previously described embodiments. In this embodiment, however, as slide plate 334 moves upward, bosses 394 contact the underside of head portions 372 of slide pins 368. Upper block 366 is pushed away from sheet guide 348 against the bias of compression springs 370, thereby disengaging the friction roller in upper block 366 from tape 24, and enabling the pilot pins to position the tape.

The process continues by reversing the rotation applied to drive connection 346, thereby retracting toggle linkages 344, and enabling slide plate 334 and sheet guide 348 to return to the original positions. Drive roller 364 is driven once again to position the section of tape to the next assembly as before, and the steps are successively repeated.

When the process is to be paused, with slide plate 334 at the lower limit of travel, wedge assembly 378 is rotated so that projections 382, 384, are positioned between surfaces 386, 388, of each heater block 374, 376, and sheet guide 348. As slide plate 334 is moved upward, projections 382, 384 hold heater blocks 374, 376, away from sheet guide 348 and prevent contact with tape 24. It will be appreciated that suitable heat shielding members or an air curtain may be interposed between heater blocks 374, 376, and tape 24 as before to prevent heat damage.

Figure 18:
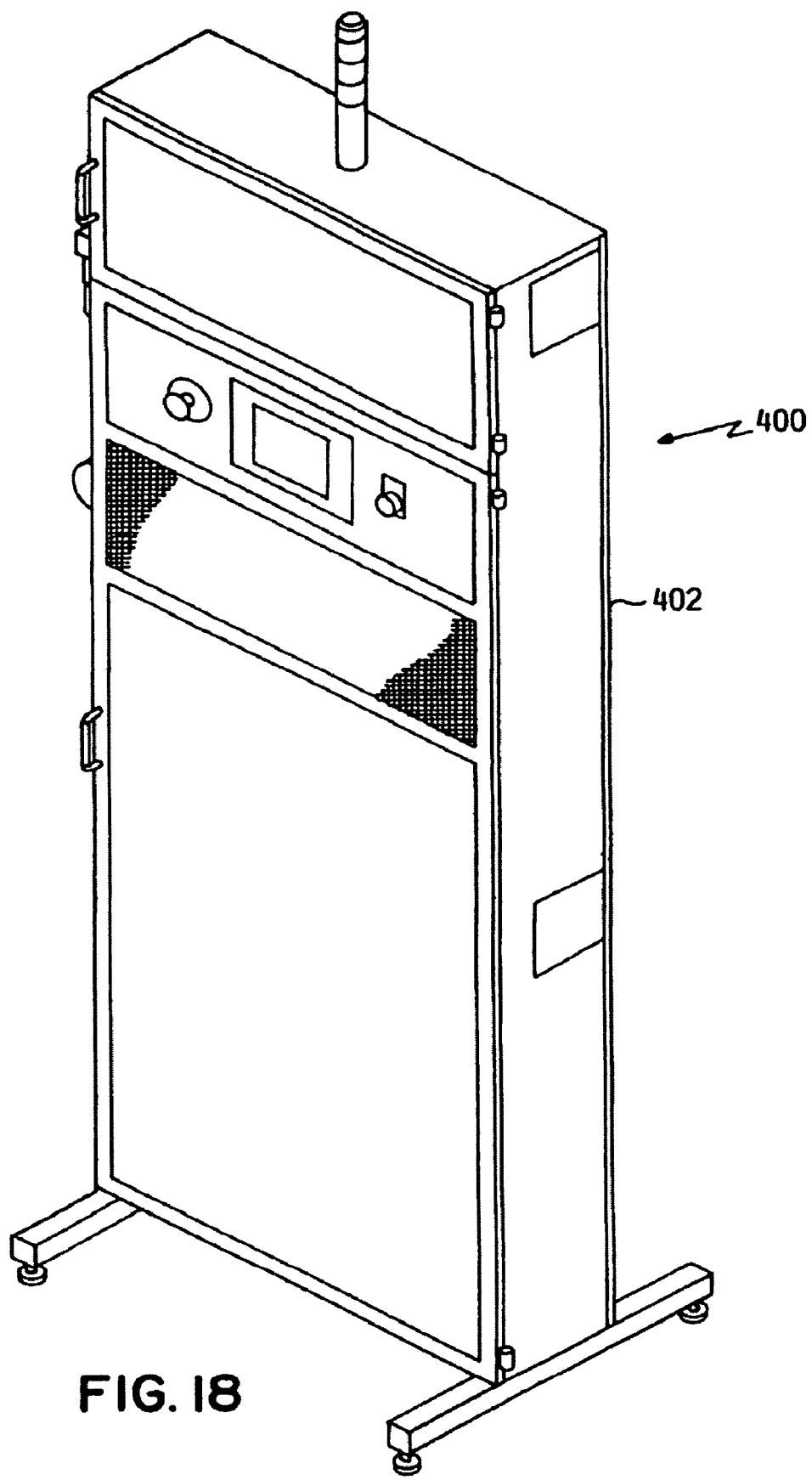
FIG. 18 is a perspective view of the exterior housing of a vertical tape forming machine in accordance with the present invention.
Figure 19:
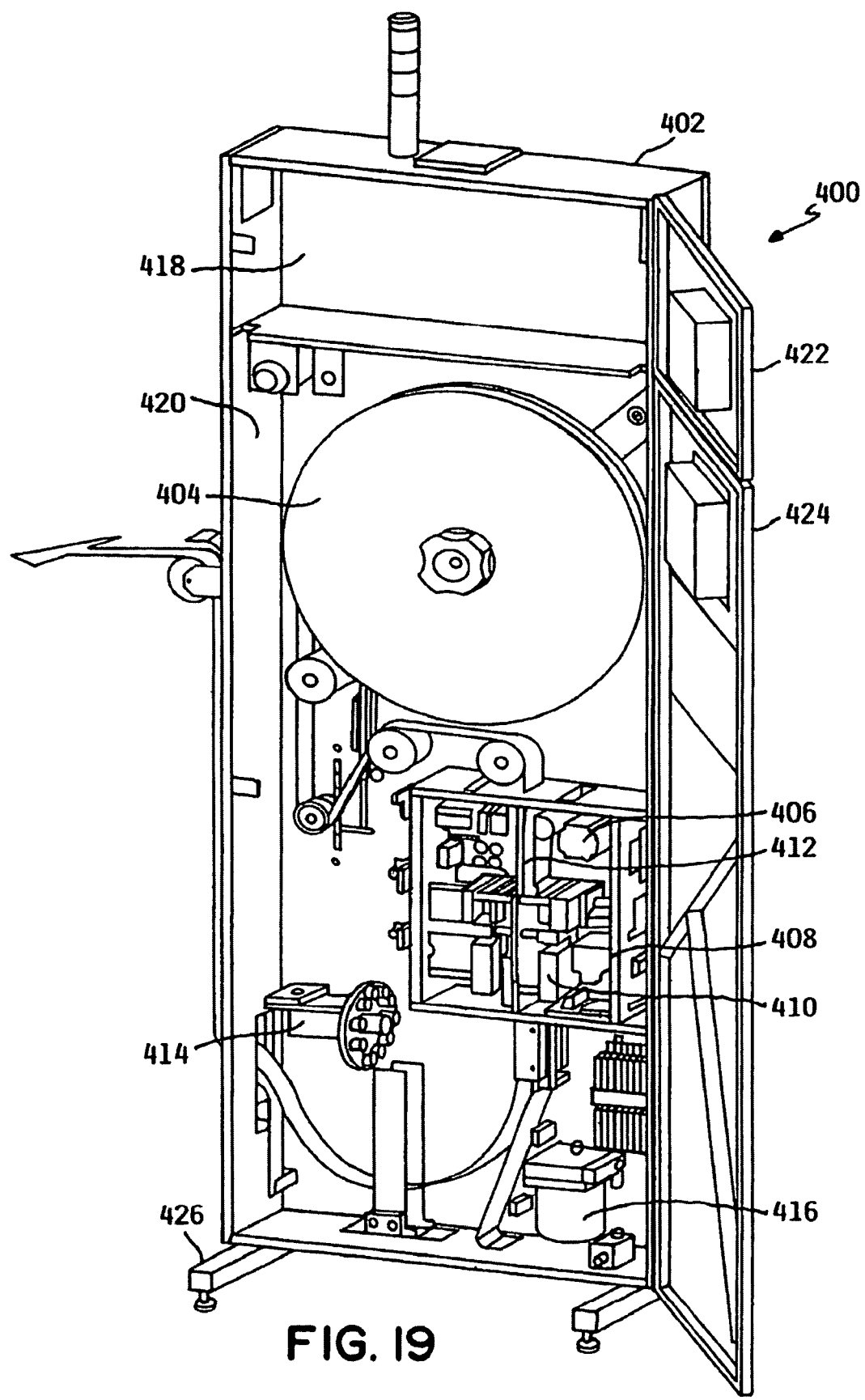
FIG. 19 is a perspective view of the general arrangement of the vertical tape forming machine.

FIGS. 18 and 19 depict another embodiment of the present invention. Vertical tape forming machine 400 generally includes frame 402 supporting reel delivery assembly 404, servo tape drive assembly 406, tool actuation assembly 408, forming tool assembly 410, heat shield assembly 412, vision system 414 and chad receptacle 416. This embodiment of the invention has several advantages including a smaller footprint, improved convective cooling and optionally machine vision quality monitoring.

Frame 402 supports and encloses the other component of the vertical tape forming machine 400. Desirably the reel delivery assembly 404 is located above servo tape drive assembly 406, tool actuation assembly 408 and forming tool assembly 410. Forming tool assembly 410 is oriented so that tape 24 passes through it at along a generally vertical path. Frame 402 generally includes upper cabinet 418 and lower cabinet 420. Upper cabinet 418 and lower cabinet 420 are accessed via upper door 422 and lower door 424, respectively. Frame 402 is supported on legs 426. Upper cabinet 418 generally encloses electronic components (not shown). Lower cabinet 420 generally encloses the remainder of the mechanical components of vertical tape forming machine 400.

Figure 21:
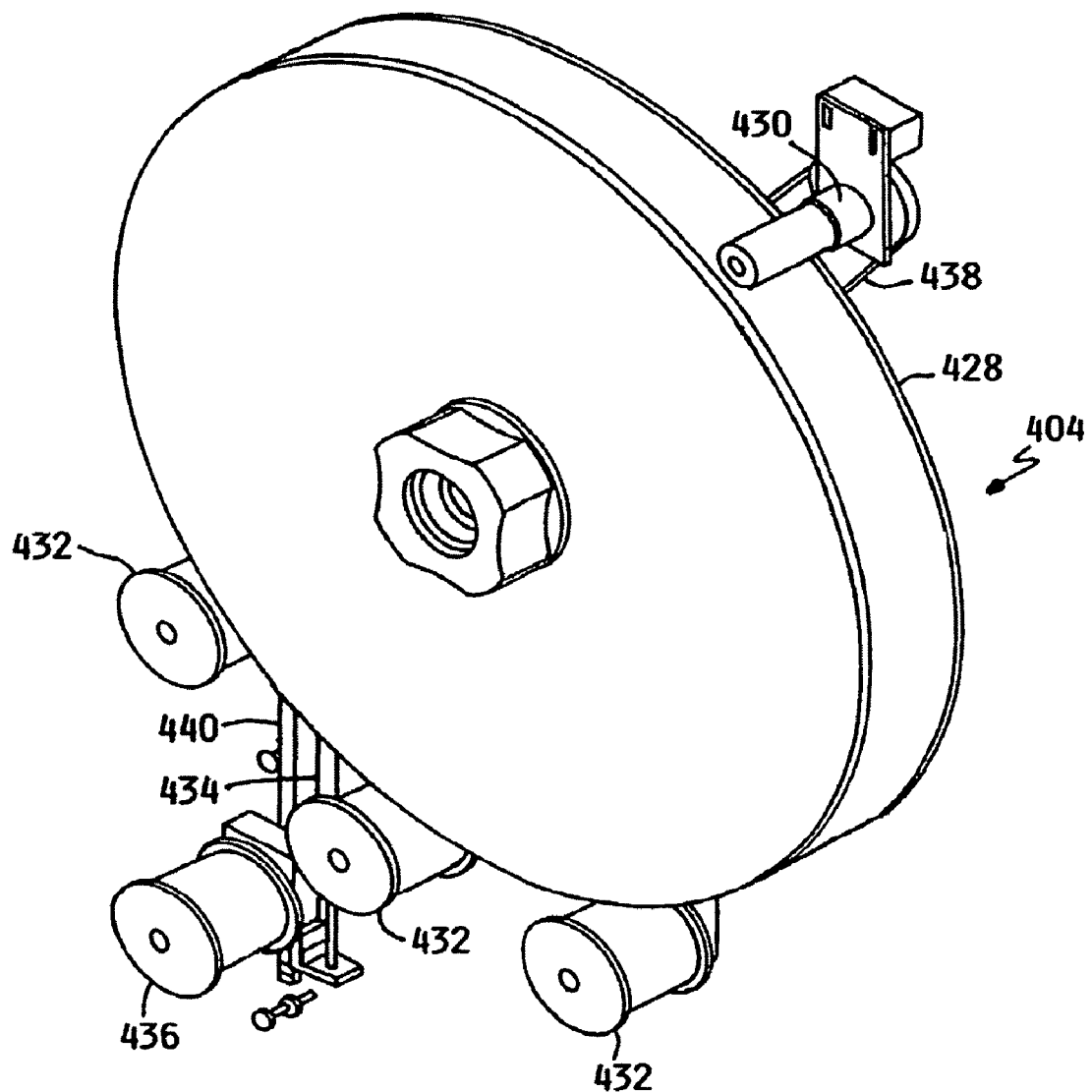
FIG. 21 is a perspective view of a reel delivery assembly in accordance with the present invention.
Figure 22:
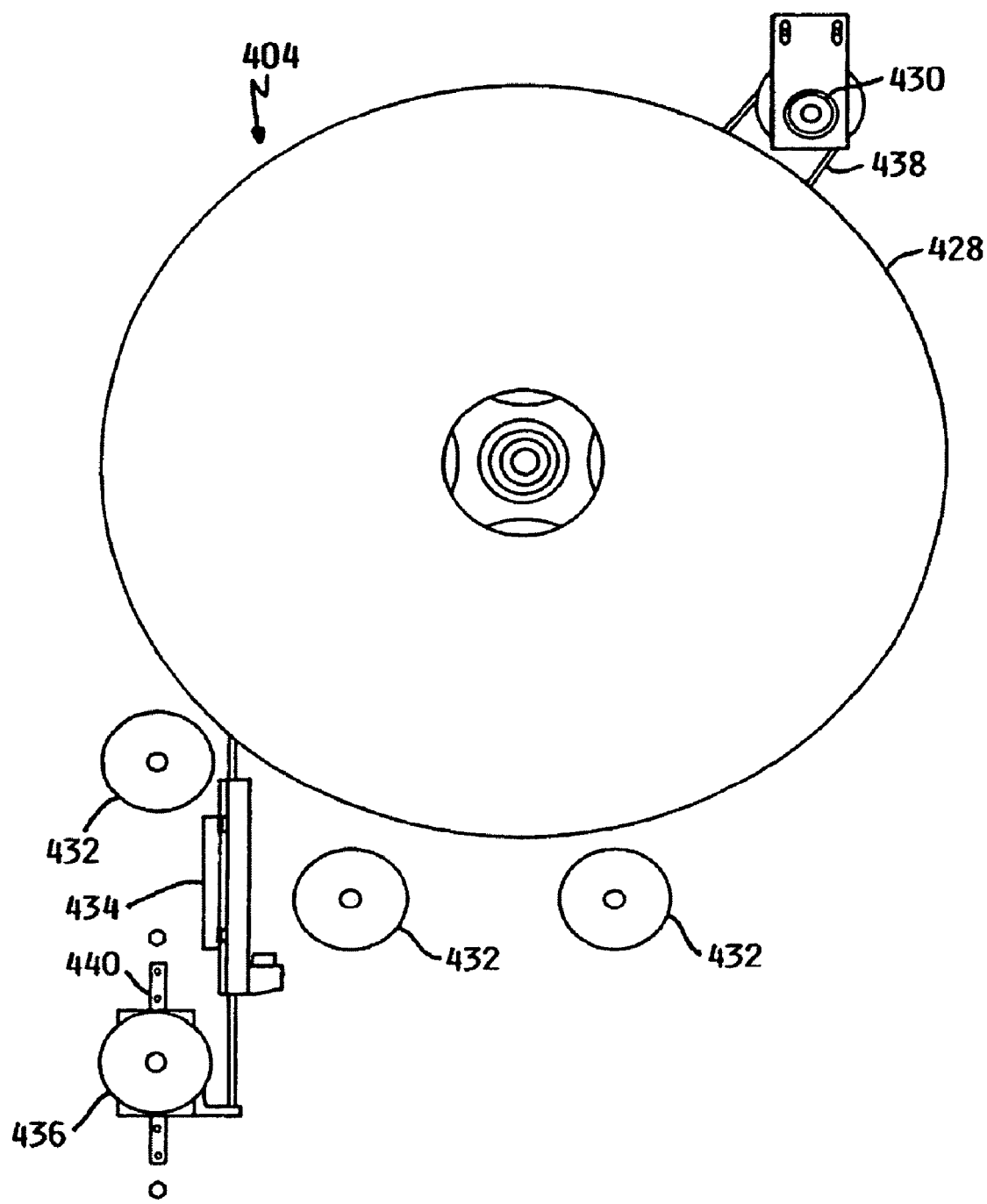
FIG. 22 is an elevational view of the reel delivery assembly.
Figure 23:
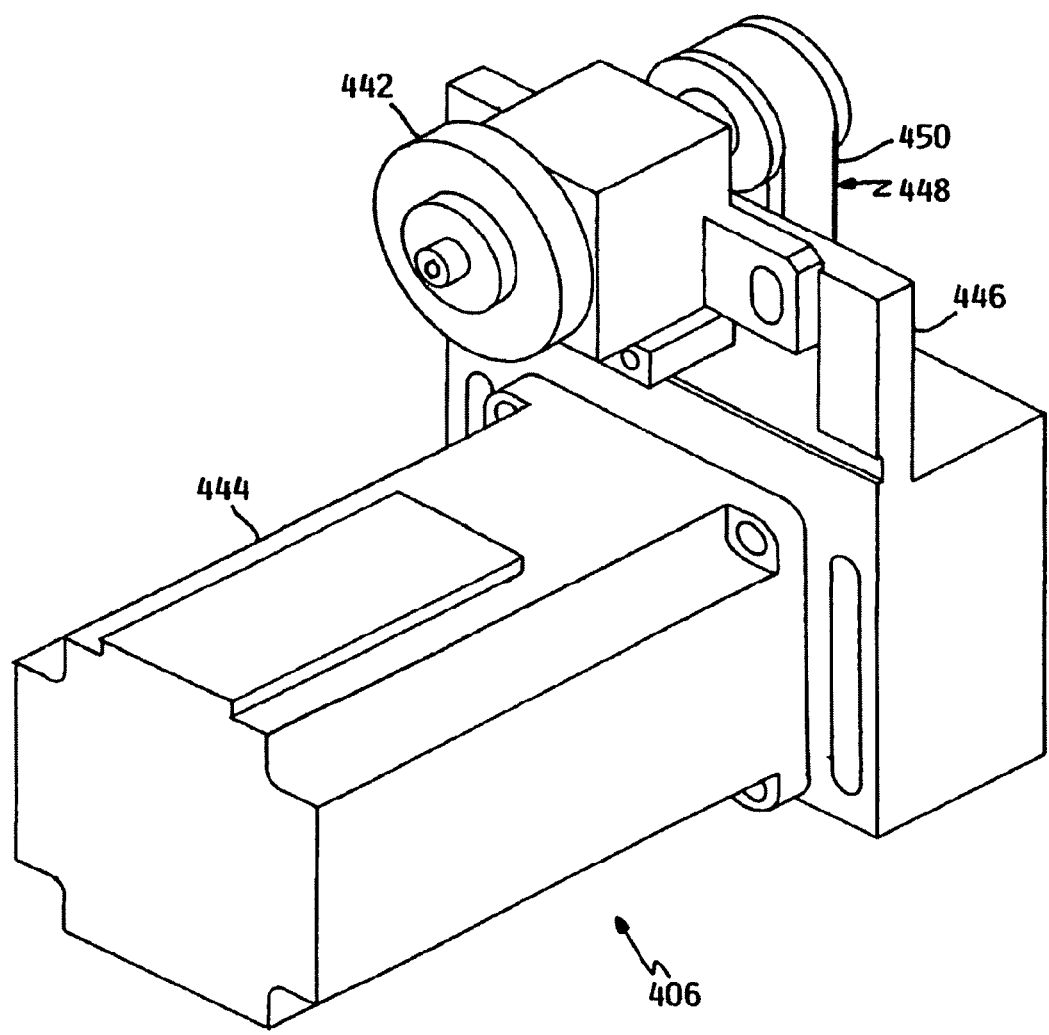
FIG. 23 is a perspective view of a servo tape drive assembly in accordance with the present invention.

Referring to FIGS. 21, 22 and 23, reel delivery assembly 404 generally includes tape reel 428, gear motor 430, stationary rollers 432, linear displacement transducer 434 and dancing roller 436.

Tape reel 428 is operably connected to gear motor 430 by toothed drive belt 438. Gear motor 430 drives tape reel 428 intermittently to insure that tape 24 is fed only when required. Gear motor 430 is desirably a small DC gear motor. Dancing roller 436 is mounted on a linear rail guide 440. Dancing roller 436 is operably connected to linear displacement transducer 434. Feed back from linear displacement transducer 434 controls gear motor 430 to drive tape reel 428, thus feeding tape when it is required by driving tape reel 428 and stopping tape feed when an excess of tape 24 is present.

Referring to FIG. 23, servo tape drive assembly 406 generally includes drive roller 442, servo motor 444, support frame 446 and belt drive 448. Driver roller 442 is desirably an overmolded drive roller formed of aluminum and overmolded with vulcanized rubber. Driver roller 442 is connected to the servo motor 446 via belt drive 448, including a toothed rubber belt 450. The servo tape drive assembly 406 advances tape in an indexed fashion through forming tool assembly 410.

Figure 24:
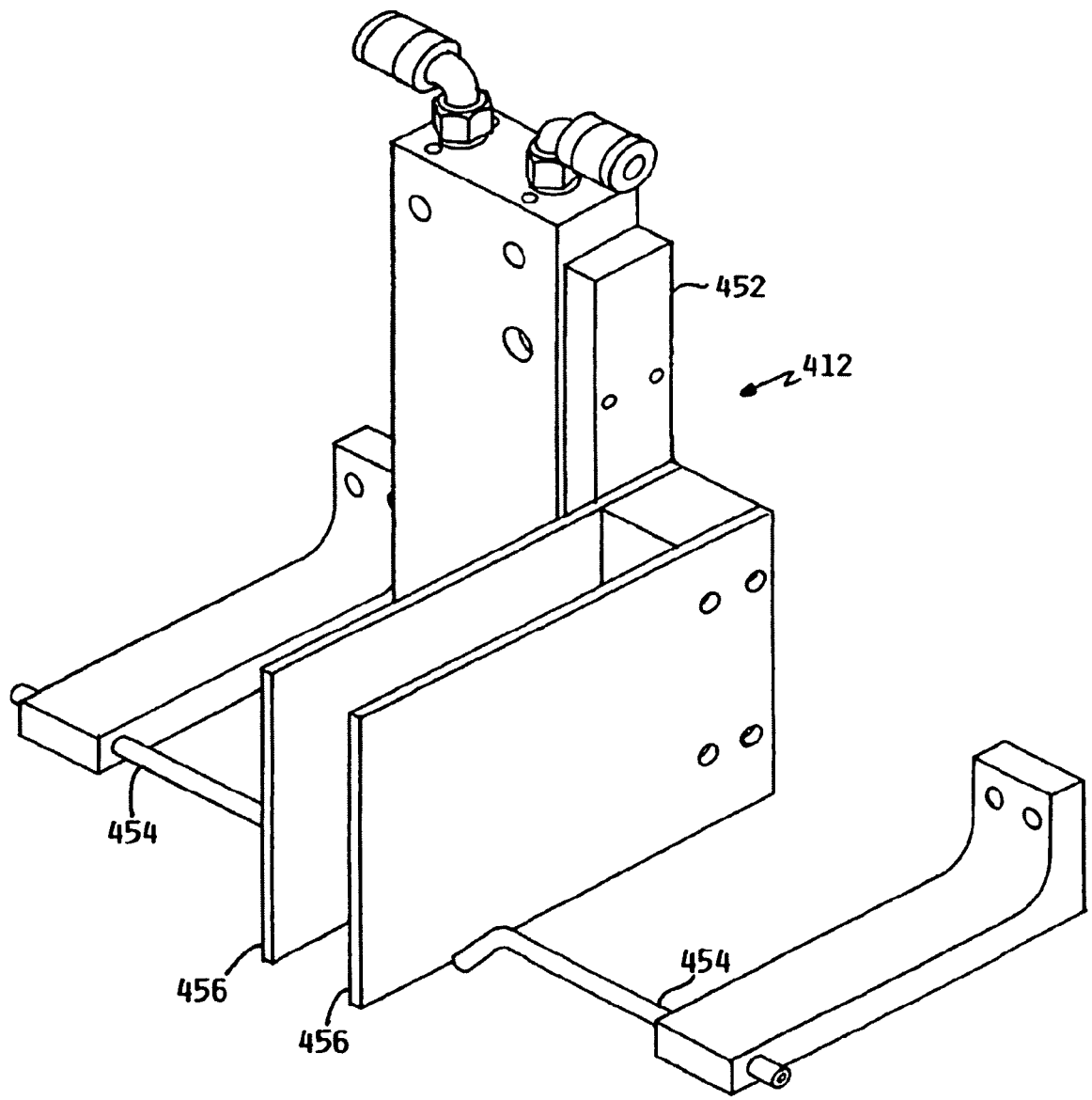
FIG. 24 is a perspective view of a tool actuation assembly in accordance with the present invention.
Figure 25:
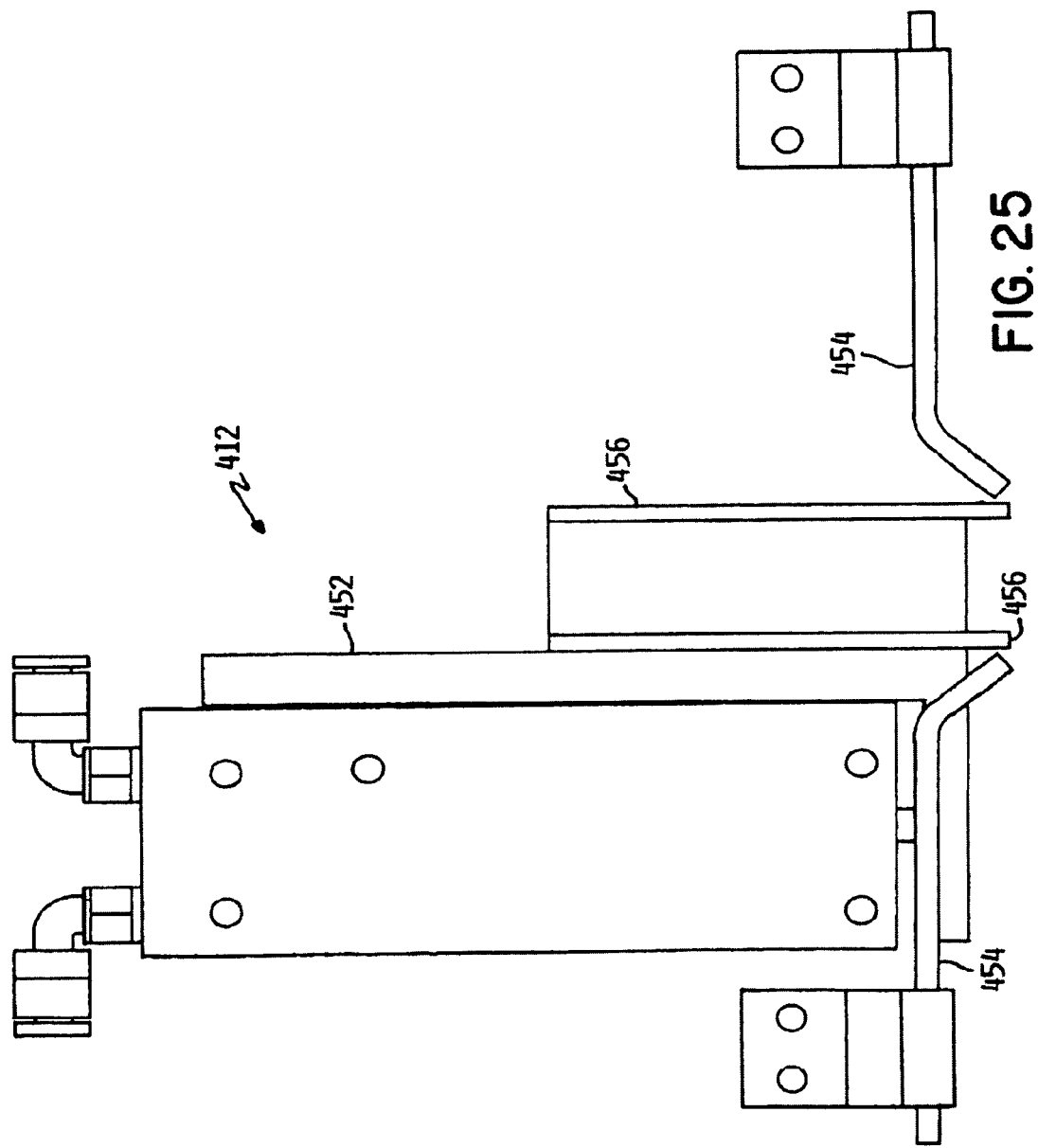
FIG. 25 is an elevational view of the tool actuation assembly.

Heat shield assembly 412, as seen in FIGS. 24 and 25, generally includes pneumatic slide 452, cooling nozzles 454 and heat shields 456. Desirably pneumatic slide 452 linearly advances or retracts heat shields 456 when actuated. Cooling nozzles 454 are attached to a source of compressed air (not shown) and directed toward tape 24 passing through forming tool assembly 410. Heat shield assembly 412 desirably includes two heat shields 456 formed of CE laminate (phenolic) spaced apart in a general parallel orientation. In this embodiment of the invention heat shields 456 are oriented generally vertically and actuated by pneumatic slide 452 to advance and retract along a vertical path.

Figure 26:
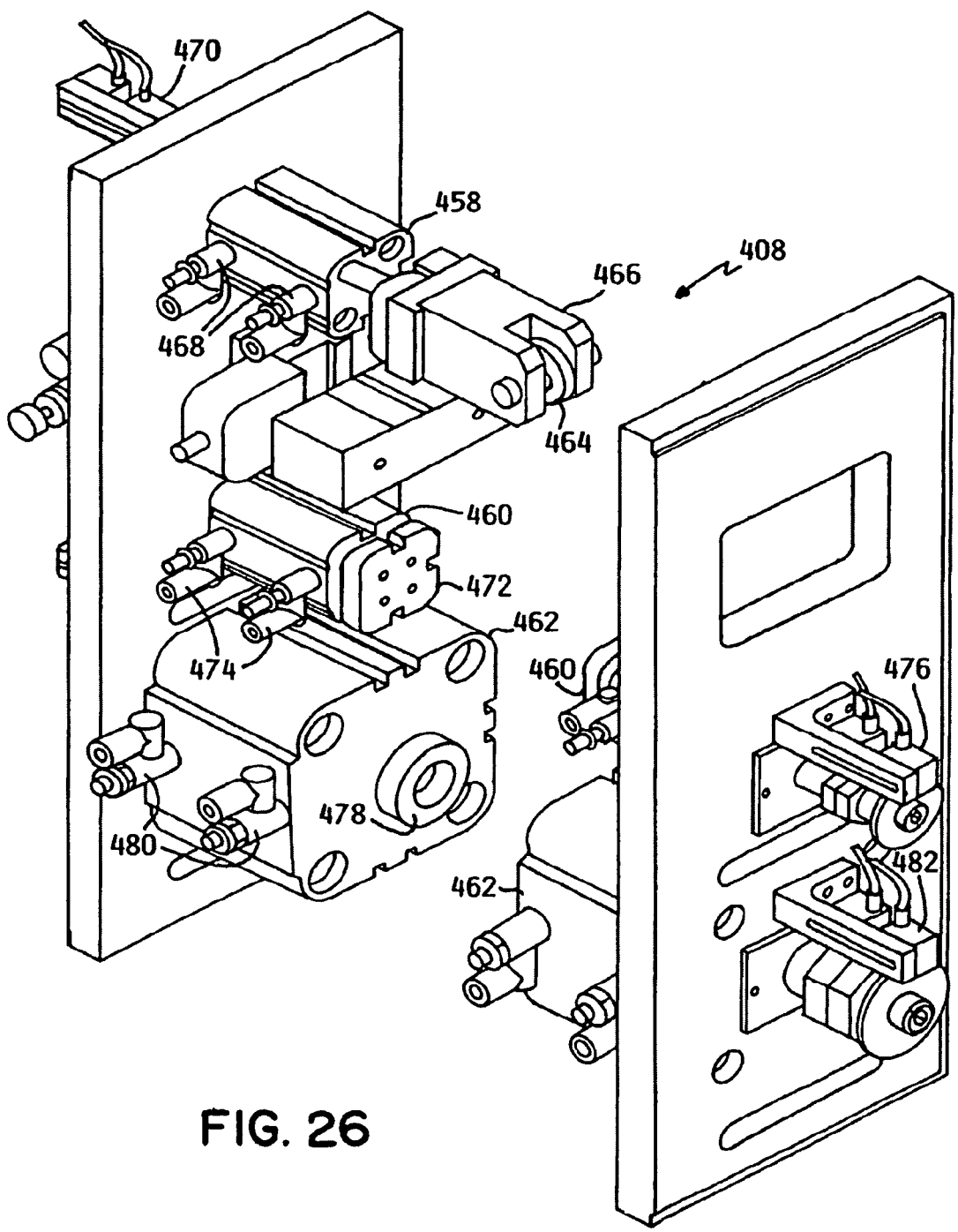
FIG. 26 is a perspective view of a forming tool assembly in accordance with the present invention.
Figure 27:
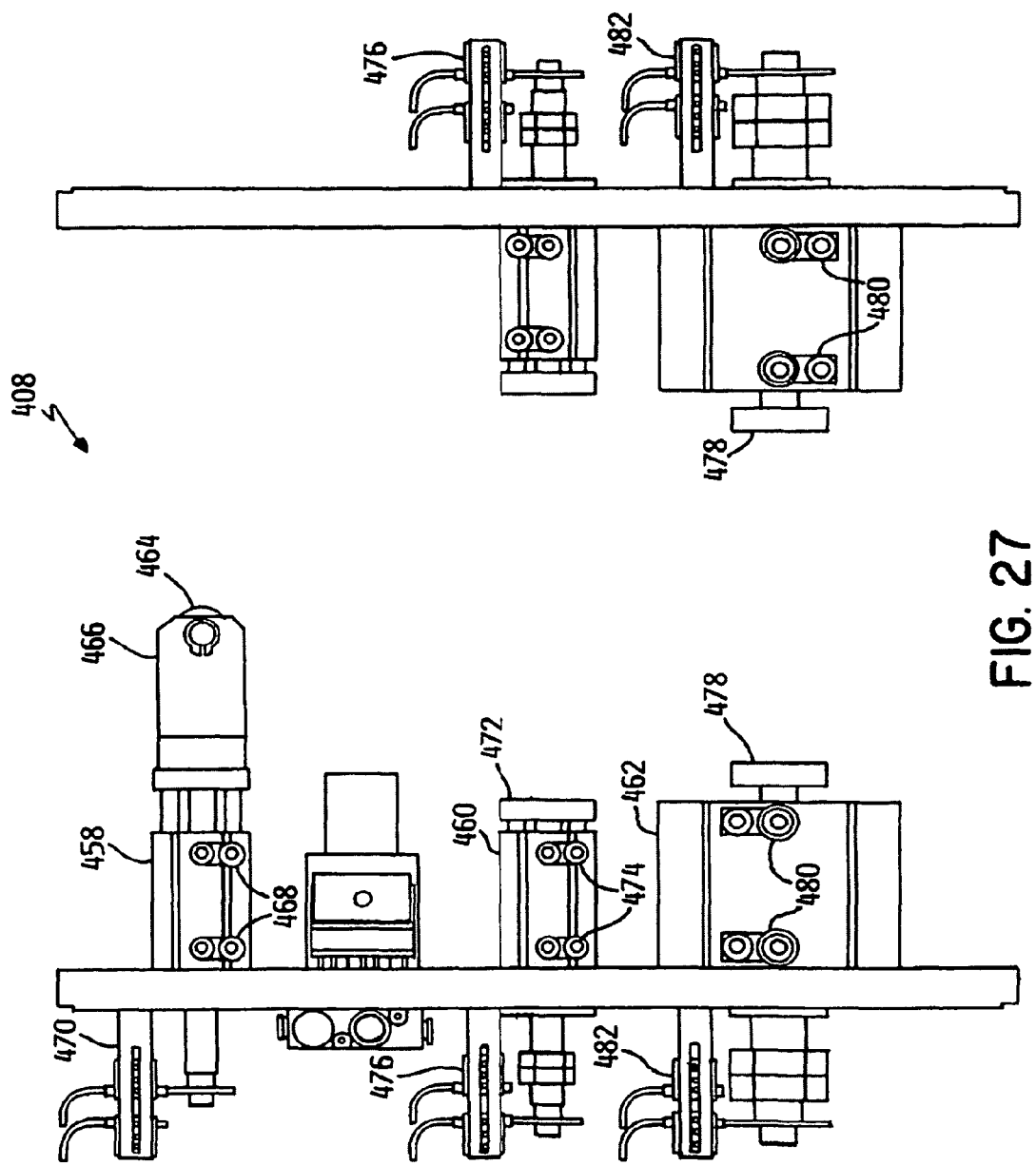
FIG. 27 is an elevational view of the forming tool assembly.

Referring to FIGS. 26 and 27, tool actuation assembly 408 generally includes back up roller cylinder 458, preheat head cylinder 460 and forming tool cylinder 462.

Back up roller cylinder 458 is operably connected to backup roller 464 which is supported in back up roller clevis 466. Back up roller cylinder 458 further includes pneumatic connections 468 and position sensors 470. Back up roller cylinder 458, as well as preheat cylinder 460 and forming tool cylinder 462, are described here as linear acting pneumatic cylinders though the functions of these components may equally well be controlled by any other linear acting actuator known to those skilled in the art.

Desirably there are two preheat head cylinders 460 opposed to one another and operating in an actuation direction toward one another. Preheat head cylinders 460 each generally include preheat head interface 472, pneumatic connections 474 and position sensors 476. Preheat head interfaces 472 are adapted to transmit linear motion from preheat head cylinder 460 to portions of forming tool assembly 410. Position sensors 476 provide feedback to preheat head cylinders 460 position to a control system (not shown).

Figure 28:
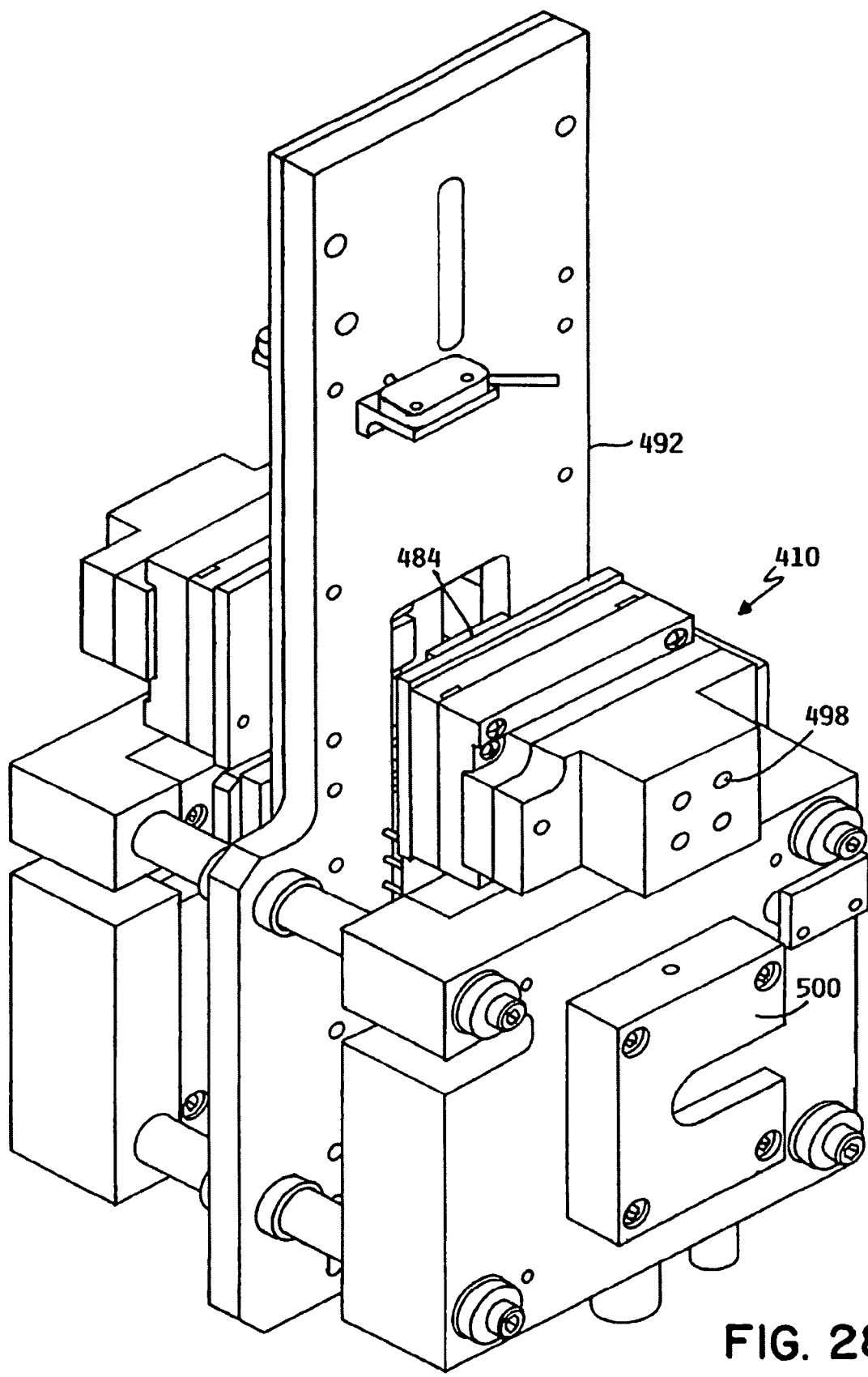
FIG. 28 is a perspective view of a heat shield assembly in accordance with the present invention with the heat shield in the up position.
Figure 29:
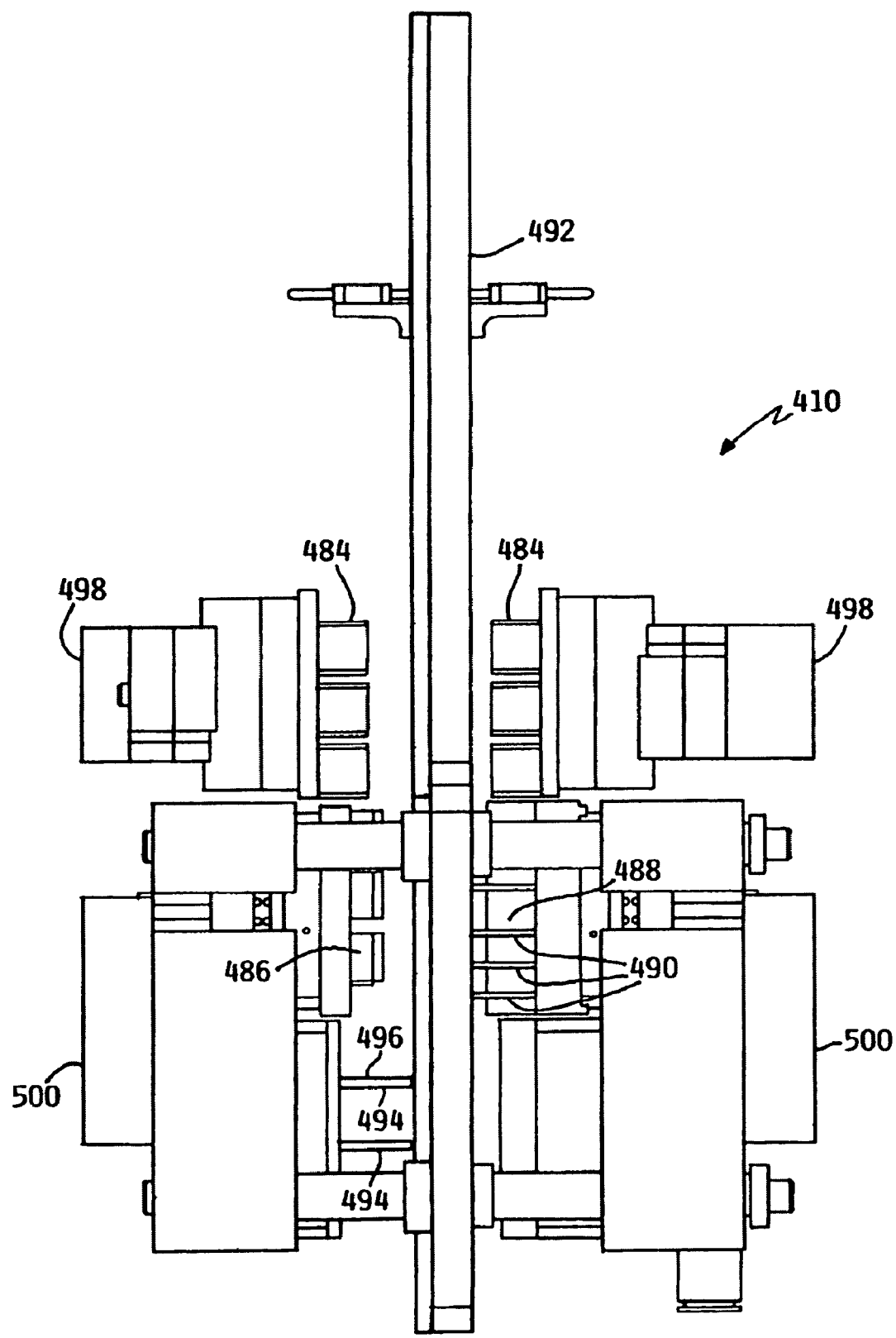
FIG. 29 is an elevational view of the heat shield assembly with the heat shield in the up position.

Referring to FIGS. 28 and 29, forming tool cylinder 462 includes forming tool interface 478, pneumatic connections 480 and position sensors 482. Forming tool interface 478 is adapted to provide a connection with portions of forming tool assembly 410. Position sensors 482 provide feedback of forming tool cylinder position to a control system (not shown).

Forming tool assembly 410, in this embodiment of the invention, is generally very similar in structure and function to forming subsystem 44 which has been described in substantial detail above. Therefore, the forming tool assembly 410 will only be described generally here.

Forming tool assembly 410 generally includes preheater heads 484, forming die 486, forming assist block 488, registration pins 490, tape guide 492 and punching tool 494. Preheater heads 484 are actuated by preheat head cylinder 460. Forming die 486, forming assist block 488, registration pins 490 and punching tool 494 are actuated as a unit by forming tool cylinder 462. Tape guide 492 provides a path to guide tape 24 through forming tool assembly 410.

In this embodiment of the invention tape guide 492 is oriented in a generally vertical position. This orientation has a number of advantages, in that it allows vertical tape forming machine 400 to have a smaller footprint than in the prior embodiment. In addition, the vertical orientation of tape guide 492 allows for convective airflow over preheater heads 484. The presence of convective airflow reduces the need to provide auxiliary airflow to cool preheater heads 484 and tape 24 when operation of vertical tape forming machine 400 is paused.

Forming die 486 and forming assist block 488 are opposed and may be advanced against each other to form a pocket in tape 24. Registration pins 490 insure that the tape is properly indexed prior to the actions taken by forming tool assembly 410. Punching tool 494 includes punch pins 496, adapted to punch a hole in each pocket after forming.

Forming tool assembly 410 further includes preheater pockets 498 and forming tool pockets 500. Preheater pockets 498 and forming tool pocket 500 are adapted to interface with preheat head interface 472 and forming tool interface 478, respectively. Preheater pockets 498 and forming tool pockets 500 thus allow forming tool assembly 410 to be inserted and removed from tool actuation assembly 408 as a unit facilitating ease of set up and ease of die change for the forming of differently configured tape 24. Specifically, the entirety of forming tool assembly 410 may be removed and replaced as a unit. This provides for ease of setup and changes in production for different sized tapes or pockets. Production downtime is minimized because an additional forming tool assembly 410 may be set up for a different production arrangement and quickly and easily changed out in a short time.

Figure 20:
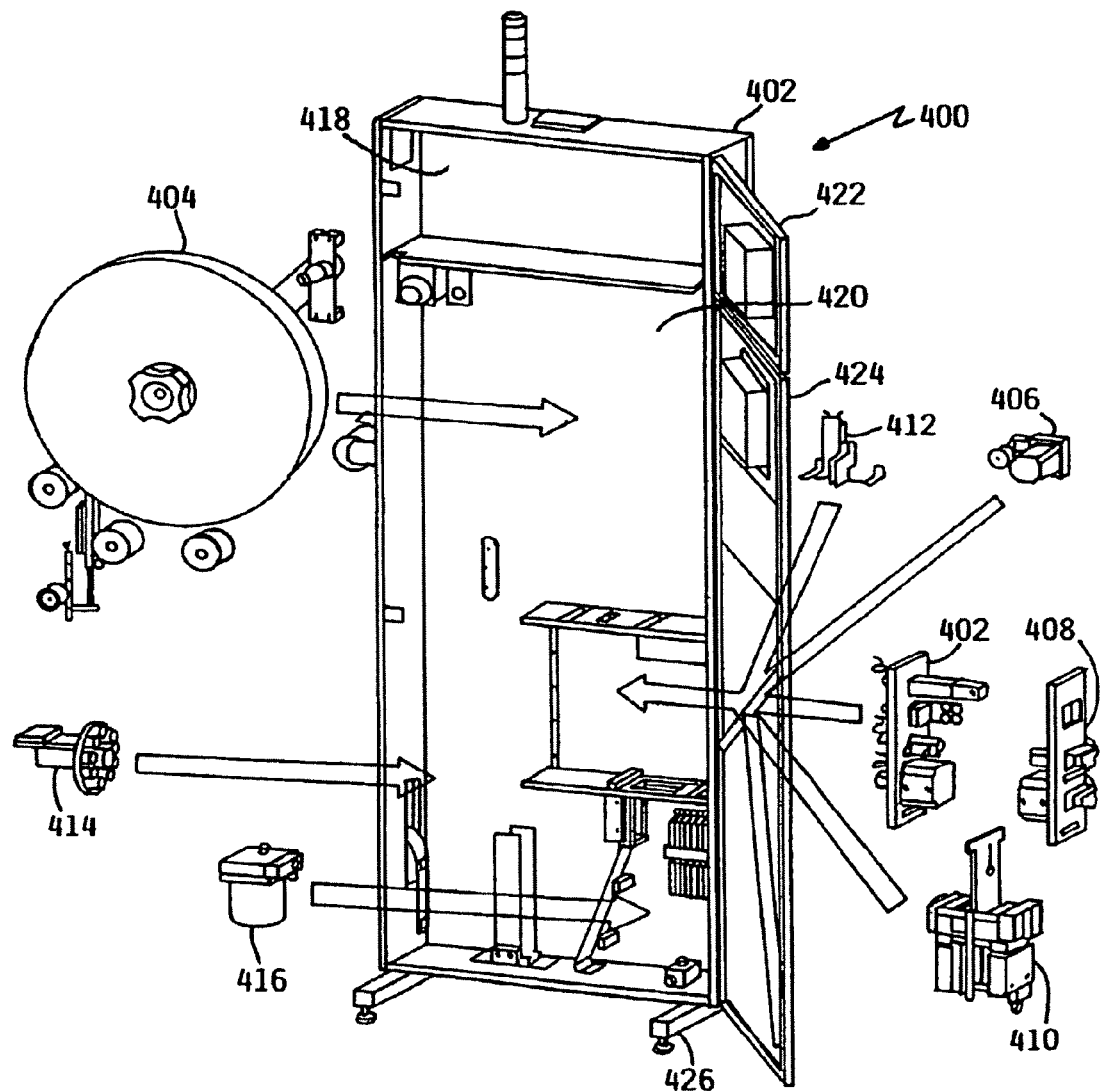
FIG. 20 is an exploded perspective view of the general arrangement of the vertical tape forming machine.
Figure 30:
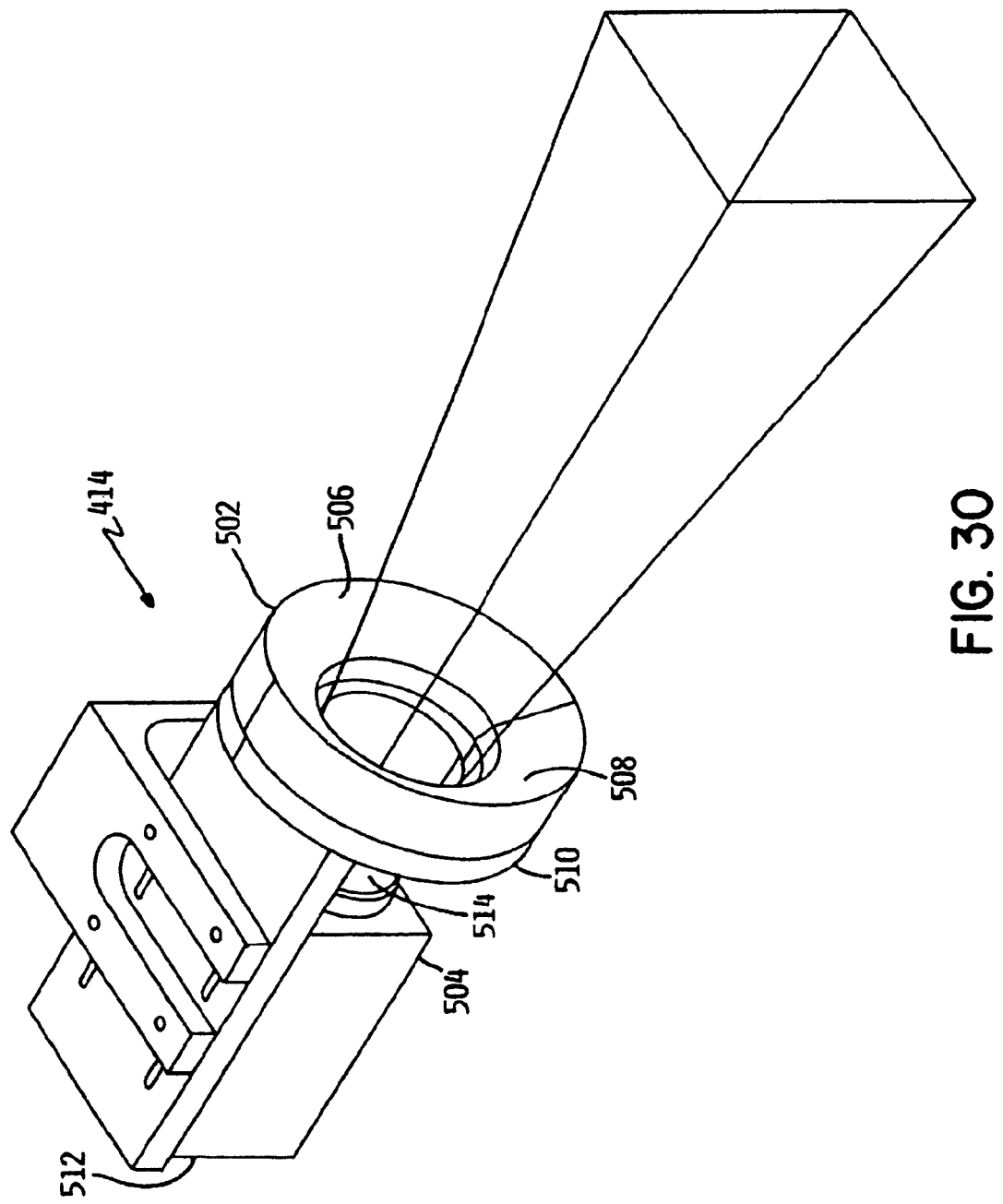
FIG. 30 is a perspective schematic view of a vision system in accordance with the present invention.

Referring to FIGS. 20 and 30, vision system 414 generally includes light source 502 and digital camera 504. Light source 502 desirably is an LED ring light source 506. LED ring light source 506 desirably includes 12 LEDs 508 on a ring shaped mounting 510.

Digital camera 504 desirably includes a 2000.times.2000 pixel progressive scan sensor 512 and a lens 514. Desirably digital camera 504 has capabilities to inspect the formed and punched tape to verify the location of the pocket with respect to one of the index holes on the side of the tape 24 (+/−100 .mu.); the pitch from pocket to pocket (+/−50 .mu.) and overall pocket quality including absence of holes, tears, etc. The vision system 414 desirably provides progressive scan digital camera output that feed images back to a computer for analysis.

Figure 31:
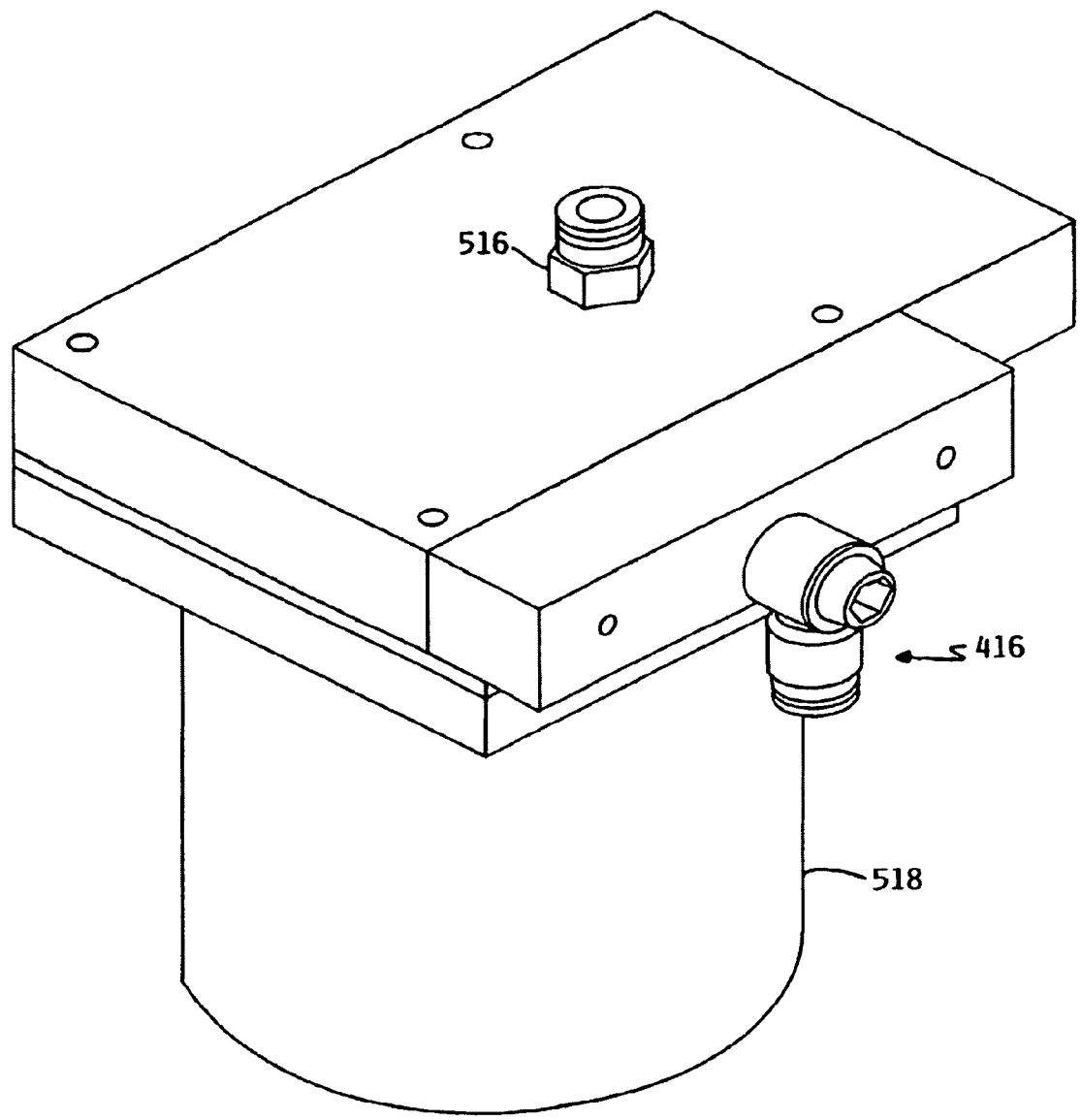
FIG. 31 is a perspective view of a chad receptacle in accordance with the present invention.

Referring to FIG. 31, chad receptacle 416 generally includes airflow assembly 516 and jar 518. As described above, airflow assembly 516 provides a continuous airflow to direct chads into jar 518. Jar 518 is adapted to be removed for emptying as needed. Jar 518 desirably is a transparent plastic jar in order to allow visual indication of when it is becoming full.

In operation reel delivery assembly 404 de-reels tape 24 from the tape reel 428 and feeds it through one of stationary rollers 432 to pass under dancing roller 436. Linear displacement transducer 434 senses the location of dancing roller 436 and thus senses the amount of tape 24 available to be driven by servo tape drive assembly 406. Gear motor 430 runs intermittently to insure the tape 24 is fed only when required. This configuration allows a buffer of tape 24 to be created the size of which can be controlled based on feedback from the linear displacement transducer 434.

Servo tape drive assembly 406 indexes tape 24 through the forming tool assembly 410. Drive roller 442 advances tape 24 when back up roller 464 is advanced against drive roller 442 to pinch tape 24 and thus allow drive roller 442 to drive it forward.

Tool actuator assembly 408 advances and retracts preheater heads 484 independently of the rest of forming tool assembly 410 which is advanced and retracted by forming tool cylinders 462.

In this embodiment of the invention, heat shield assembly 412 may be advanced to interpose heat shields 456 between preheater heads 484 and tape 24 when it is necessary to pause production. At the same time, cooling nozzles 454 can direct cooling air between heat shields 456 and the tape 24. The vertical orientation of heat shield assembly 412 has the advantage of enabling convection cooling of heat shields 456 and tape 24, thus minimizing the need for airflow from cooling nozzles 454.

The operation of forming tool assembly 410 is substantially similar to that of forming subsystem 44 described above and therefore will not be further described at this time.

The present invention may be embodied in other specific forms without departing from the central attributes thereof, therefore, the illustrated embodiment should be considered in all respects as an illustrative and not restrictive, reference being made to the appended claims rather than the foregoing description to indicate the scope of the invention.

What is claimed is:

1. A process for filling embossed pockets of a carrier tape performed sequentially in one integrated process, comprising:
providing a flat tape having sprocket holes, and being wound about a reel;
aligning the flat tape in a substantially vertical plane;
receiving the flat tape aligned with the substantially vertical plane in a forming tool assembly of a first apparatus;
creating pockets in the flat tape to create a carrier tape while the flat tape is in the first apparatus, said creating pockets comprises inserting a pilot pin into one of the sprocket holes while the one of the sprocket holes is located adjacent a molding assembly; and
filling the pockets.

2. The process of claim 1, further comprising:
where said creating pockets in the substantially vertically aligned flat tape to create a carrier tape comprises:
using a carrier tape embossing apparatus, as said first apparatus, adapted to perform an embossing process where the pockets are automatically sequentially embossed in adjacent uniform increments of the substantially vertically aligned flat tape by sequential contact with a heating assembly separate from the molding assembly, both comprised in the forming tool assembly, so as to produce the carrier tape at a tape production rate, the carrier tape embossing apparatus adapted so that the embossing process is selectively intermittently pausable without causing damage to the flat tape;
supplying the carrier tape to a piece of carrier tape processing equipment, the equipment adapted to accept the carrier tape at a tape input rate;
sensing a parameter related to the tape production rate using a first sensor;
sensing a parameter related to the tape input rate using a second sensor; and
using a processor connected with the first and second sensors and the carrier tape embossing apparatus to intermittently pause the embossing process.

3. The process of claim 1, further comprising:
where said creating pockets in the flat tape to create a carrier tape comprises:
automatically positioning an increment of the substantially vertically aligned flat tape in the forming tool assembly of the first apparatus between a pair of opposing positionable heating contact surfaces;
contacting the tape with the contact surfaces so as to heat a region of the increment to a forming temperature;
positioning the increment so that the region is between a pair of positionable mold members of the forming tool assembly, the pair of mold members including a male mold member and a female mold member;
engaging the region with the male and female mold members to form the pocket; and
intermittingly pausing the process by maintaining the strip in a fixed position and interposing a heat shield between each heating contact surface and the strip, and
where the carrier tape is produced at a tape production rate.

4. The process of claim 3, further comprising:
supplying the carrier tape to a piece of carrier tape processing equipment, the equipment adapted to accept the carrier tape at a tape input rate;
sensing a parameter related to the tape production rate using a first sensor;
sensing a parameter related to the tape input rate using a second sensor; and
using a processor connected with the first and second sensors and the first apparatus to intermittingly pause the creating pockets process.

5. The process of claim 3, further comprising:
where said filling the pockets occurs prior to any winding of the carrier tape and occurs at a piece of carrier tape processing equipment.

6. The process of claim 1, further comprising:
said filling the pockets occurs prior to any winding of the carrier tape and occurs in a second apparatus;
connecting the first apparatus to a second apparatus at one and only one location; and
said connecting step consists of running the carrier tape from the first apparatus to the second apparatus.

7. The process of claim 1, further comprising:
integrating the first apparatus with a second apparatus, and where the first apparatus is a carrier tape embossing apparatus and the second apparatus is a carrier tape processing apparatus.

8. The process of claim 1, further comprising:
sensing a parameter related to a tape production rate of the first apparatus using a first sensor;
sensing a parameter related to a tape input rate of a second apparatus using a second sensor; and
adjusting the tape production rate to substantially equal the tape input rate.

9. The process of claim 1 where the sprocket holes are pre-punched and further comprising positioning the reel of flat tape substantially in vertical alignment with the forming tool assembly; and
receiving the vertically aligned flat tape in a tape guide that is parallel to the vertical plane, and
where the forming tool assembly comprises the flat tape guide and a heating assembly vertically aligned with a forming assembly.

10. The process of claim 9 further comprising positioning the reel of flat tape directly above the forming tool assembly.

11. The process of claim 1 further comprising a pair of opposing selectively positionable heating contact surfaces horizontally spaced from one another and vertically positioned in the first apparatus to received the vertically aligned tape.

12. The process of claim 1 where the reel and forming tool assembly are contained within a cabinet of the first apparatus.

13. The process of claim 1 where the sprocket holes are pre-punched and further comprising:
positioning the reel of flat tape substantially in vertical alignment with, and directly above, the forming tool assembly;
positioning a pair of opposing, horizontally spaced and selectively positionable heating contact surfaces of the forming tool assembly vertically with respect to the reel of flat tape and within the first apparatus; and
positioning the reel and forming tool assembly within a cabinet of the first apparatus.

14. The process of claim 1 where said inserting a pilot pin step occurs simultaneous with a step of engaging a heated region of the tape with male and female mold members to form the pocket.

15. The process of claim 14 further comprising punching a hole in a bottom of one of the created pockets simultaneous with said step of creating pockets.

16. The process of claim 15 where the pockets are created at a first region of the tape, said simultaneous punching a hole step occurs immediately adjacent to the first region of the tape.

17. The process of claim 16 further comprising heating a region of the tape adjacent the first region and where said inserting a pilot pin occurs simultaneously with said step of punching a hole, said step of heating, and said step of creating a pocket.

18. The process of claim 1 further comprising a plurality of pilot pins connected to said molding assembly, said creating pockets further comprising inserting said plurality of pilot pins into respective sprocket holes of the tape adjacent said molding assembly.

19. A process for filling embossed pockets of a carrier tape performed sequentially in an integrated process, comprising:
feeding a flat tape having sprocket holes into a first apparatus;
creating pockets in the flat tape to create a carrier tape, comprising:
aligning the flat tape with a substantially vertical plane;
producing the carrier tape using the first apparatus adapted to perform an embossing process wherein the pockets are automatically sequentially embossed in adjacent uniform increments of the substantially vertically aligned flat tape by sequential contact with a heating assembly and a separate molding assembly substantially vertically aligned with the heating assembly for receiving the substantially vertically aligned flat tape so as to produce the carrier tape at a tape production rate: and
inserting a pilot pin into one of the sprocket holes adjacent the molding assembly, and
where the first apparatus is adapted so that the embossing process is selectively intermittently pausable without causing damage to the flat tape;
supplying the carrier tape to a piece of carrier tape processing equipment separate and spaced horizontally from the first apparatus, the equipment adapted to accept the carrier tape at a tape input rate;
sensing a parameter related to the tape production rate using a first sensor;
sensing a parameter related to the tape input rate using a second sensor;
pausing the embossing process intermittently in response to a processor connected with the first and second sensors; and
inserting a heat shield assembly between the heating assembly and the flat tape in response to the processor connected with the first and second sensors; and
filling the pockets.

20. The process of claim 19, further comprising:
said filling step comprises loading a component into each pocket of the carrier tape.

21. The process of claim 20, further comprising:
applying a cover tape over the pockets, and
where the carrier tape processing equipment further includes an apparatus for applying the cover over the pockets.

22. The process of claim 19, further comprising:
where the heating assembly includes a pair of contact portions, each contact portion having a contact surface, selectively positionable so as to contact opposite sides of the substantially vertically aligned tape to heat a region of each increment, where the first apparatus further includes the heat shield assembly adapted to selectively interpose a heat shield between each contact surface and the substantially vertically aligned tape when the process is paused, and interposing heat shields along a path substantially parallel to the vertical plane between each contact surface and the tape when the embossing process is paused.

23. The process of claim 22, further comprising:

said interposing heat shields between each contact surface and the tape comprises simultaneously interposing a separate heat shield plate portion between a separate one of the contact portions and the tape, and where the heat shield assembly includes a body portion and a pair of spaced apart shield plate portions projecting therefrom, the shield plate portions adapted to be selectively positionable so that each shield member is disposed between the tape and a separate one of the contact portions.

24. The process of claim 23, further comprising:

directing air onto a surface of each shield plate portion, and where said heat shield assembly includes a pair of air diffusers in the body portion, each diffuser positioned so as to direct air onto the surface of a separate one of the shield plate portions.

25. The process of claim 19, further comprising:

said creating pockets step, further comprising:

adjusting the tape production rate to substantially equal the tape input rate.

26. The process of claim 19, further comprising:

emitting a first signal from the processor when the tape input rate is greater than zero and the tape input rate is less than the tape production rate;

said pausing step occurs in response to the first signal; and said inserting step occurs in response to the first signal.

27. The process of claim 26, further comprising:

emitting a second signal from the processor when the tape input rate is equal to or greater than the tape production rate;

starting the embossing process intermittently in response to the second signal; and removing the heat shield assembly in response to the second signal.

28. A process for filling embossed pockets of a carrier tape performed sequentially in an integrated process, comprising:

feeding a continuous strip of plastic material into a first apparatus;

aligning the continuous strip of plastic material with a vertical plane;

creating pockets in the continuous, vertically aligned strip of plastic material to create a carrier tape, comprising:

(a) automatically positioning an increment of the vertically aligned strip between a pair of opposing horizontally spaced and selectively positionable heating contact surfaces vertically positioned in the first apparatus in a manner capable of receiving the vertically aligned strip;

(b) momentarily contacting the strip with the contact surfaces so as to heat a region of the increment to a forming temperature;

(c) positioning the increment so that the region is between a pair of selectively positionable mold members, the pair of mold members including a male mold member and a female mold member oriented to receive the vertically aligned strip;

(d) engaging the region with the male and female mold members to form the pockets;

(e) punching a hole in a bottom of a formed pocket simultaneously with said engaging step; and (f) intermittently pausing the process by maintaining the strip in a fixed position and interposing a heat shield between each heating contact surface and the strip; and filling the pockets.

29. The process of claim 28, further comprising:

sensing a parameter related to a tape production rate using a first sensor operably connected with a processor;

comparing, by using the processor, the parameter with a desired value for the parameter; and initiating, by using the processor, the step of intermittently pausing the process based on a result of the comparison.

30. The process of claim 28, further comprising:

repeating steps (a), (b), (c), (d), (e) and (f) for adjacent increments of the strip.

31. A process for filling embossed pockets of a carrier tape performed sequentially in one integrated process, comprising:

receiving in a forming tool assembly of a first apparatus a flat tape having sprocket holes;

creating pockets in a first region of the flat tape to create a carrier tape while the flat tape is in the first apparatus, said creating pockets comprising inserting a pilot pin into one of the sprocket holes while the one of the sprocket holes is located adjacent a molding assembly;

punching a hole in a pocket positioned immediately adjacent the first region of the tape, said punching step occurring simultaneous with creating a pocket in the first region of the tape; and filling the pockets.

32. The process of claim 31 further comprising a plurality of pilot pins positioned adjacent mold members of said molding assembly.

33. The process of claim 31 further comprising heating a region of the tape adjacent the first region, said heating occurring where the region of the flat tape is aligned in a substantially vertical plane.

34. The process of claim 33 where said inserting a pilot pin occurs simultaneously with said step of punching a hole, said step of heating, and said step of creating a pocket.

35. The process of claim 33 where said flat tape is wound about a reel and further comprising pivoting a heat shield to insert said heat shield between a heating assembly and the flat tape in a pause mode.

36. The process of claim 35 where heating blocks of said heating assembly maintain temperature during a pause mode.

* * * * *